United States Patent
Kushiyama

[11] Patent Number: 5,991,218
[45] Date of Patent: Nov. 23, 1999

[54] DYNAMIC RANDOM ACCESS MEMORY

[75] Inventor: Natsuki Kushiyama, Yokohama, Japan

[73] Assignee: Kabushiki Kaisha Toshiba, Kawasaki, Japan

[21] Appl. No.: 09/116,145

[22] Filed: Jul. 15, 1998

[30] Foreign Application Priority Data

Jul. 16, 1997 [JP] Japan ................................. 9-191440

[51] Int. Cl.$^6$ .................................................. G11C 7/00
[52] U.S. Cl. ...................... 365/222; 365/230.03; 365/200
[58] Field of Search ............................. 365/222, 230.03, 365/200, 189.07

[56] References Cited

U.S. PATENT DOCUMENTS

| | | | |
|---|---|---|---|
| 5,313,423 | 5/1994 | Sato et al. ................................. | 365/200 |
| 5,691,949 | 11/1997 | Hively et al. ........................ | 365/222 X |

*Primary Examiner*—Huan Hoang
*Attorney, Agent, or Firm*—Loeb & Loeb, LLP

[57] ABSTRACT

The case where a memory cell array comprises 1st, 2nd, ... $2^n$-th sub-arrays is considered. In this case, when the refresh mode is started, a refresh counter produces an n-bit sub-array selection address signal for selecting the 1st, 2nd, ... $2^n$-th sub-arrays one by one in order and a row address signal for selecting a plurality of rows in each sub-array one by one in order. In case a defective row including a retention-defective memory cell exists in the m-th (wherein m stands for 1, 2, ... or $2^n$) sub-array, the conversion of the sub-array selection address signal is performed and such a new sub-array selection address signal as to select the m-th sub-array and the k-th sub-array at the same time is produced when the sub-array selection address signal has selected the k-th (wherein k stands for 1, 2, ... or $2^n$, and k≠m) sub-array and the row address signal has become the same as the row address signal for selecting the defective row.

22 Claims, 20 Drawing Sheets

| ENABLE BIT | RETENTION DEFECT ADDRESS MEMORY ||||||||||||
|---|---|---|---|---|---|---|---|---|---|---|---|---|
| | SUB-ARRAY SELECTION SIGNAL || ROW ADDRESS SIGNAL |||||||||||
| | RADR <12> | RADR <11> | RADR <10> | ... | | | | | | | ... | RADR <0> |
| 1 | 1 | 0 | 0 | 0 | 0 | 0 | 0 | 0 | 0 | 0 | 0 | 1 |
| 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 |
| | | | | | ⋮ | | | | | | | |
| 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | n SET (1 BIT+12 BITS)×n BIT

FIG. 7

| SUB-ARRAY | SUB-ARRAY SELECTION SIGNAL | | ROW ADDRESS SIGNAL | | | | | | | | | |
|---|---|---|---|---|---|---|---|---|---|---|---|---|
| | A<11> | A<10> | A<9> | A<8> | A<7> | A<6> | A<5> | A<4> | A<3> | A<2> | A<1> | A<0> |
| 0 | 0 | 0 | 0 | 0 | 0 | 0 | 0 | 0 | 0 | 0 | 0 | 0 |
| | | | 0 | 0 | 0 | 0 | 0 | 0 | 0 | 0 | 0 | 1 |
| | | | 0 | 0 | 0 | 0 | 0 | 0 | 0 | 0 | 1 | 0 |
| | | | ⋮ | | | | | | | | | |
| | | | 1 | 1 | 1 | 1 | 1 | 1 | 1 | 1 | 0 | 1 |
| | | | 1 | 1 | 1 | 1 | 1 | 1 | 1 | 1 | 1 | 0 |
| | | | 1 | 1 | 1 | 1 | 1 | 1 | 1 | 1 | 1 | 1 |
| 1 | 0 | 1 | 0 | 0 | 0 | 0 | 0 | 0 | 0 | 0 | 0 | 0 |
| | | | 0 | 0 | 0 | 0 | 0 | 0 | 0 | 0 | 0 | 1 |
| | | | 0 | 0 | 0 | 0 | 0 | 0 | 0 | 0 | 1 | 0 |
| | | | ⋮ | | | | | | | | | |
| | | | 1 | 1 | 1 | 1 | 1 | 1 | 1 | 1 | 0 | 1 |
| | | | 1 | 1 | 1 | 1 | 1 | 1 | 1 | 1 | 1 | 0 |
| | | | 1 | 1 | 1 | 1 | 1 | 1 | 1 | 1 | 1 | 1 |
| 2 | 1 | 0 | 0 | 0 | 0 | 0 | 0 | 0 | 0 | 0 | 0 | 0 |
| | | | 0 | 0 | 0 | 0 | 0 | 0 | 0 | 0 | 0 | 1 |
| | | | 0 | 0 | 0 | 0 | 0 | 0 | 0 | 0 | 1 | 0 |
| | | | ⋮ | | | | | | | | | |
| | | | 1 | 1 | 1 | 1 | 1 | 1 | 1 | 1 | 0 | 1 |
| | | | 1 | 1 | 1 | 1 | 1 | 1 | 1 | 1 | 1 | 0 |
| | | | 1 | 1 | 1 | 1 | 1 | 1 | 1 | 1 | 1 | 1 |
| 3 | 1 | 1 | 0 | 0 | 0 | 0 | 0 | 0 | 0 | 0 | 0 | 0 |
| | | | 0 | 0 | 0 | 0 | 0 | 0 | 0 | 0 | 0 | 1 |
| | | | 0 | 0 | 0 | 0 | 0 | 0 | 0 | 0 | 1 | 0 |
| | | | ⋮ | | | | | | | | | |
| | | | 1 | 1 | 1 | 1 | 1 | 1 | 1 | 1 | 0 | 1 |
| | | | 1 | 1 | 1 | 1 | 1 | 1 | 1 | 1 | 1 | 0 |
| | | | 1 | 1 | 1 | 1 | 1 | 1 | 1 | 1 | 1 | 1 |

4,096 ROW/128ms

FIG. 9

| SUB-ARRAY | SUB-ARRAY SELECTION SIGNAL | | ROW ADDRESS SIGNAL | | | | | | | | | | |
|---|---|---|---|---|---|---|---|---|---|---|---|---|---|
| | A<11> | A<10> | A<9> | A<8> | A<7> | A<6> | A<5> | A<4> | A<3> | A<2> | A<1> | A<0> | |
| 0 | 0 | 0 | 0 | 0 | 0 | 0 | 0 | 0 | 0 | 0 | 0 | 0 | ⎫ 62.5 μs |
| | | | 0 | 0 | 0 | 0 | 0 | 0 | 0 | 0 | 0 | 1 | ⎬ 62.5 μs |
| | | | 0 | 0 | 0 | 0 | 0 | 0 | 0 | 0 | 1 | 0 | |
| | | | ⋮ | | | | | | | | | | |
| | | | 1 | 1 | 1 | 1 | 1 | 1 | 1 | 1 | 0 | 1 | ⎫ 62.5 μs |
| | | | 1 | 1 | 1 | 1 | 1 | 1 | 1 | 1 | 1 | 0 | ⎬ 62.5 μs |
| | | | 1 | 1 | 1 | 1 | 1 | 1 | 1 | 1 | 1 | 1 | ⎬ 62.5 μs |
| 1 | 0 | 1 | 0 | 0 | 0 | 0 | 0 | 0 | 0 | 0 | 0 | 0 | ⎬ 62.5 μs |
| | | | 0 | 0 | 0 | 0 | 0 | 0 | 0 | 0 | 0 | 1 | ⎬ 62.5 μs |
| | | | 0 | 0 | 0 | 0 | 0 | 0 | 0 | 0 | 1 | 0 | |
| | | | ⋮ | | | | | | | | | | |
| | | | 1 | 1 | 1 | 1 | 1 | 1 | 1 | 1 | 0 | 1 | ⎫ 62.5 μs |
| | | | 1 | 1 | 1 | 1 | 1 | 1 | 1 | 1 | 1 | 0 | ⎬ 62.5 μs |
| | | | 1 | 1 | 1 | 1 | 1 | 1 | 1 | 1 | 1 | 1 | ⎬ 62.5 μs |
| 2 | 1 | 0 | 0 | 0 | 0 | 0 | 0 | 0 | 0 | 0 | 0 | 0 | ⎬ 62.5 μs |
| | | | 0 | 0 | 0 | 0 | 0 | 0 | 0 | 0 | 0 | 1 | ← 62.5 μs  * |
| | | | 0 | 0 | 0 | 0 | 0 | 0 | 0 | 0 | 1 | 0 | ⎬ 62.5 μs |
| | | | ⋮ | | | | | | | | | | |
| | | | 1 | 1 | 1 | 1 | 1 | 1 | 1 | 1 | 0 | 1 | ⎫ 62.5 μs |
| | | | 1 | 1 | 1 | 1 | 1 | 1 | 1 | 1 | 1 | 0 | ⎬ 62.5 μs |
| | | | 1 | 1 | 1 | 1 | 1 | 1 | 1 | 1 | 1 | 1 | ⎬ 62.5 μs |
| 3 | 1 | 1 | 0 | 0 | 0 | 0 | 0 | 0 | 0 | 0 | 0 | 0 | ⎬ 62.5 μs |
| | | | 0 | 0 | 0 | 0 | 0 | 0 | 0 | 0 | 0 | 1 | ⎬ 62.5 μs |
| | | | 0 | 0 | 0 | 0 | 0 | 0 | 0 | 0 | 1 | 0 | |
| | | | ⋮ | | | | | | | | | | |
| | | | 1 | 1 | 1 | 1 | 1 | 1 | 1 | 1 | 0 | 1 | ⎫ 62.5 μs |
| | | | 1 | 1 | 1 | 1 | 1 | 1 | 1 | 1 | 1 | 0 | ⎬ 62.5 μs |
| | | | 1 | 1 | 1 | 1 | 1 | 1 | 1 | 1 | 1 | 1 | |

RETENTION-DEFECTIVE ROW 4,096 ROW/256ms

FIG. 10

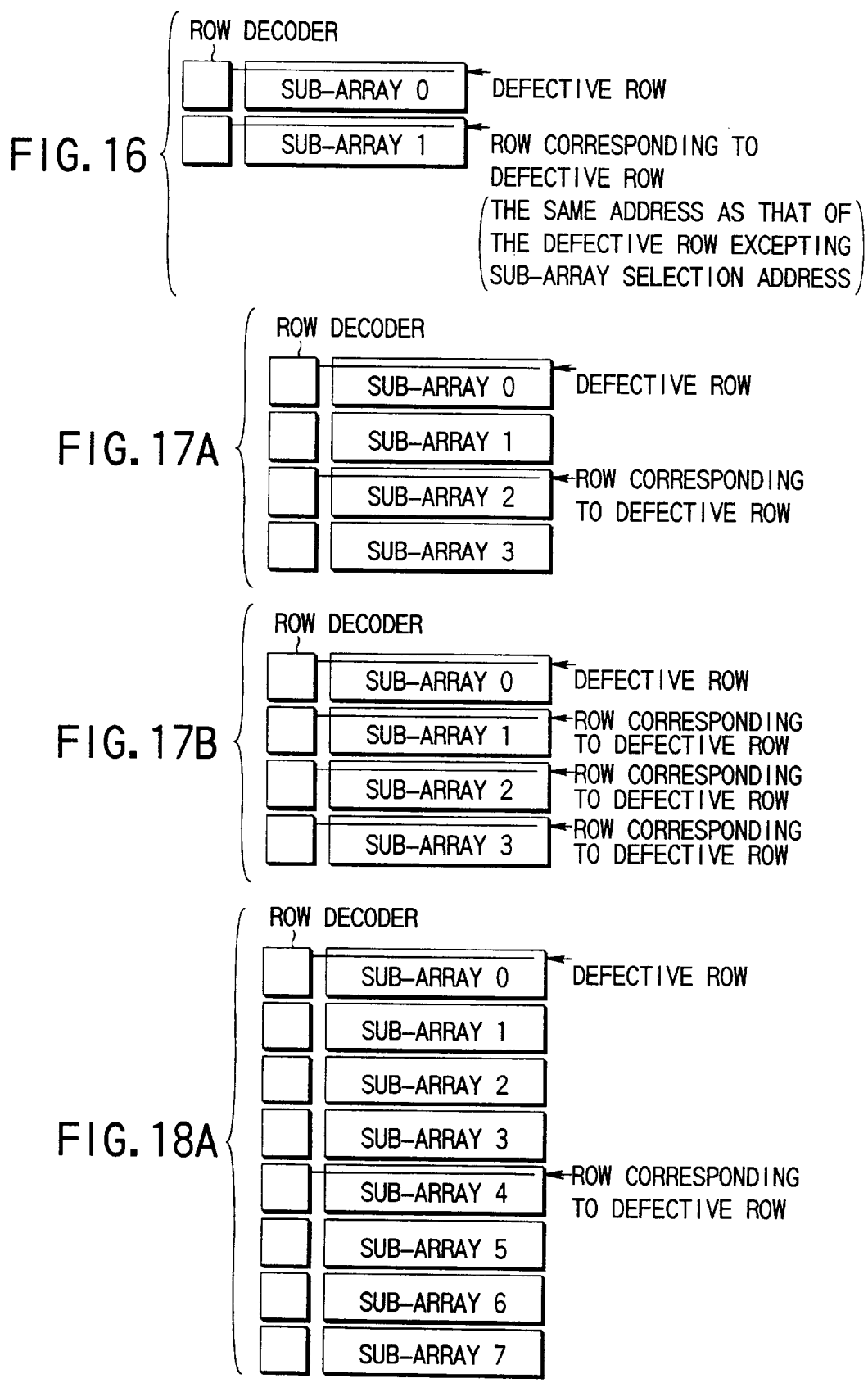

DYNAMIC RANDOM ACCESS MEMORY

BACKGROUND OF THE INVENTION

The present invention relates to a dynamic random access memory.

The memory cells of a dynamic random access memory (hereinafter referred to as DRAM) are each composed of one transfer transistor and one cell capacitor. In one memory cell, one-bit data, that is, "0" data or "1" data is stored. The data in the memory cell is determined depending on whether or not charges are accumulated in the cell capacitor.

However, the charges accumulated in the cell capacitor gradually leak out from the cell capacitor with the lapse of time. Thus, in a memory cell in the cell capacitor of which charges have been accumulated by writing, the amount of charges in the cell capacitor gradually reduce after the writing. If this state is left as it is, then the data stored in the memory cell changes.

Thus, in the case of a DRAM, in the state in which the power supply is ON, the data in the memory cells thereof is read out before the data is changed due to the leakage of the charges therein, and accurate data is written into the memory cells, that is, the data refresh operation is performed.

The refresh operation is carried out in the following procedure.

On the basis of the address generated by a refresh counter in the chip, the rows of the memory cell array are selected one by one in due order. In the row thus selected, a high potential is applied to the word line, so that the transfer transistors in the memory cells connected to the word line are turned on. Thus, from each of the memory cells belonging to the selected row, the data (the absence or presence of charges in the cell capacitor) is read out onto the bit line. The data thus read out onto the respective bit line is amplified by a sense amplifier and written into the memory cell again.

The refresh operation must be performed before the data in the memory cells is changed due to the leakage of the charges therein. Thus, here the following terms are defined in connection with the refresh operation:

Refresh cycle (C): The cycle number of refresh operations which must be performed in order to refresh all the memory cells. In case, by one refresh operation, one row is selected, the cycle number thereof is equal to the number of rows in the memory cell array.

Refresh interval (t ri): The interval between the refresh operations performed for one and the same memory cell which interval is determined on condition that the data in the memory cell be not changed by the leakage of the charges in the cell capacitor. This interval is equal to the time spent for the values of the refresh counter to make one round.

Refresh period (t rp): The period of time spent for one refresh operation.

The refresh cycle C, the refresh interval t ri, and the refresh period t rp have the following relationship among them:

$$t\ ri = t\ rp \times C \quad (1)$$

For instance, in the case of a 64-Mbit DRAM having a memory capacity of 64 megabits, the number of rows is 4,096, so that the refresh cycle C becomes 4,096. The refresh interval t ri is 64 ms. In this case, the refresh period t rp becomes about 15,625 $\mu$s.

In recent years, mobile computers such as notebook personal computers etc. are rapidly becoming popular. The feature of a mobile computer lies in the point that it can be freely used anywhere, and therefore, in the use thereof, a battery is used as the power source of the mobile computer in many cases.

Therefore, the increase in the length of time during which the battery can be continuously used becomes an important matter to the mobile computer.

In order to increase the time length of continuous use of the battery, it is sufficient to increase the capacity of the battery or to reduce the power consumption of the circuits (such as, e.g. CPU, memories, etc.) in the computer.

For instance, the technical measure of stopping the operation of the memories in the computer when no signal is inputted for a certain fixed time from input devices such as the keyboard, the mouse, etc. contributes to the reduction in power consumption of the mobile computer.

However, the DRAM used as the main memory of the computer must be periodically refreshed, as mentioned above, in order to prevent the loss of the data.

Thus, what is called the average current I ave for refresh will be defined below, through which examination will be made of the power consumption caused by the refresh operation.

The average current I ave is defined by the following equation (2):

$$I\ ave = \{I\ row \times t\ ac \times C\}/t\ ri \quad (2)$$

wherein I row: Current which flows when one row is accessed to perform a refresh operation.
t ac: Time for which one row is accessed.
C: Refresh cycle.
t ri: Refresh interval.

The average current I ave for refresh means the average value of the current used when refresh is performed. Therefore, in order to reduce the power consumed when a refresh operation is performed, it is sufficient to reduce the average current I ave for refresh.

For instance, the average current for refresh in a 64-Mbit DRAM will be examined below. In the case of a commercially available 64-Mbit DRAM, I row is 100 mA, t ac is 80 ns, C is 4,096 cycles, and t ri is 64 ms.

Therefore, the average current I ave for refresh is obtained, in accordance with the above-given equation (2), as follows:

$$I\ ave = \{100\ mA \times 80\ ns \times 4,096\}/64\ ms$$

$$= about\ 512\ \mu A.$$

According to the specifications of DRAMs with low power consumption in 1996, the average current I ave for refresh is required to be 250 $\mu$A or below. The average refresh current of the above-mentioned 64-Mbit DRAM is about 512 $\mu$A, which does not conform to the specifications.

In order to satisfy the above-mentioned specifications, it is sufficient, according to the above-indicated equation (2), to reduce I row and t ac or to increase t ri. However, I row and t ac are factors relating to the basic performance of the DRAM, and therefore, it is difficult to alter them. Thus, in order to reduce the average refresh current I ave, it is the best choice to increase the refresh interval t ri.

More concretely, in order to make the average refresh current I ave less than 250 $\mu$A, the refresh interval t ri must be made at least $2^2$ times as large as 64 ms, that is, 256 ms.

However, if the refresh interval t ri is increased, then the interval between the refresh operations performed for one and the same memory cell is increased. Due to this, in the case of a memory cell which has a poor retention (pause) characteristic, that is, a memory cell in which the speed at which the charges leak from the cell capacitor thereof is high, the data is inverted before the refresh thereof is performed in some cases.

In order to prevent the occurrence of such a trouble, in the case of a conventional DRAM, a memory cell having a poor retention characteristic, that is, a memory cell having a retention time (the time for which charges in an amount not below the threshold value can be retained) of 256 ms or below is recognized as a defective memory cell as in the case of a memory cell which is structurally defective.

Therefore, a row or a column including a memory cell which has a retention defect is replaced with a spare row or a spare column by a redundancy circuit so that all the memory cells may have a retention time of 256 ms or more.

In this way, in the conventional DRAM, the refresh interval t ri is increased, and thus, the average refresh current I ave is reduced, whereby the power consumption during the execution of a refresh operation is reduced. Further, the problem that memory cells having retention defects are increased as a result of increasing the refresh interval t ri is overcome by substituting spare cells for those memory cells which have retention defects.

However, the number of defective memory cells (defective rows or defective columns) which can be relieved by means of a redundancy circuit has its limit. This point will be further described below.

For instance, it is to be assumed that there are 200 (on the average) memory cells which each ones have a retention time longer than 128 ms and shorter than 256 ms, and the other memory cells each have a retention time of 256 ms or longer.

Those memory cells which have poor retention characteristics, that is, the memory cells which each have a retention time longer than 128 ms and shorter than 256 ms are produced at random in the wafer. Due to this, the distribution of the memory cells which have retention defects can be expressed in the form of Poisson distribution. In this case, if 218 optional memory cells in the memory cell array (64 megabits) are replaced by spare cells, then a manufacturing yield of 90% can be obtained (computer simulation).

However, the memory cell arrays of the recent DRAMSs are each comprised of a plurality of sub-arrays. In this case, the redundancy elements, that is, the spare decoder (row or column) and the spare line (row or column) is provided for each of the sub-arrays, and the redundancy elements associated with one sub-array cannot relieve the defective memory cells of other sub-arrays.

In case the number of redundancy elements is fixed, the relief efficiency obtained when an equal number of redundancy elements are assigned to each of a plurality of sub-arrays is lower than the relief efficiency achieved when the redundancy elements are provided for one memory cell array.

For instance, with reference to 64-Mbit DRAMs, examination will be made below of a 64-Mbit DRAM comprising only a 64-Mbit bit memory cell array and of a 64-Mbit DRAM comprising thirty-two 2-Mbit sub-arrays.

Here, it is to be further assumed that, to the memory capacity of 64 megabits, 64 redundancy elements are provided.

In the case of the DRAM comprising only a 64-Mbit memory array, 64 arbitrary defective memory cells in the memory cell array can be relieved even in the worst case. On the other hand, in the case of the DRAM comprising thirty-two 2-Mbit sub-arrays, two redundancy elements are provided for each sub-array. Therefore, in the worst case, only two arbitrary defective memory cells in one sub-array can be relieved.

Thus, in the case of the DRAM comprising only a 64-Mbit memory cell array, even if 64 defective memory cells are produced concentratively in a part of the interior of the memory cell array, these defective memory cells can be relieved, whereas, in the case of the DRAM comprising thirty-two 2-Mbit sub-arrays, if three or more defective memory cells are produced within one sub-array, all the defective memory cells cannot be relieved in some cases.

According to a computer simulation using the Poisson distribution, in the case of the DRAM comprising only a 64-Mbit memory cell array (the replacement region is of 64 megabits), if it is assumed that 200 (on the average) memory cells having retention defects exist in one chip, then a manufacturing yield of 90% can be obtained by providing 218 redundancy elements.

On the other hand, in the case of the DRAM comprising thirty-two 2-megabit sub-arrays (the replacement region is of 2 mega bits), if it is assumed that 200 (on the average) memory cells having retention defects exist in one chip, then it is possible to obtain a manufacturing yield of 90% unless 14 redundancy elements are provided for each sub-array, that is, the total number of 448 redundancy elements are provided for the thirty-two sub-arrays.

Here, a concrete example of the case where one redundancy element is provided corresponding to one spare row decoder will be described.

FIG. 1 shows an example of the floor plan of a 64-Mbit DRAM. FIG. 2 shows a row decoder area.

According to this example, the memory cell array is comprised of four blocks BLK0 to BLK3 disposed in the row direction, The blocks BLK0 to BLK3 each have a memory capacity of 16 mega bits. The blocks BLK0 to BLK3 are each comprised of eight 2-Mbit sub-arrays disposed in the column direction. Thus, the memory cell array as a whole is comprised of thirty-two 2-Mbit sub-arrays.

The sub-arrays each have 512 rows (word lines) and 4,096 columns. Between the respective adjacent eight sub-arrays in each block, sense amplifier areas are disposed.

Row decoder areas are disposed at a one-side end, in the row direction, of the four blocks BLK0 to BLK3. The word lines extend from the row decoder area towards the other end in the row direction. The word lines are provided commonly in the four blocks BLK0 to BLK3. A row fuse area is disposed adjacent to the row decoders. In the row fuse area, there are formed fuses in which defective row addresses are stored.

Column decoder areas are disposed at one-side ends, in the column direction, of the respective blocks BLK0 to BLK3. Column select lines extend from the column decoder areas towards the other ends in the column direction. A column fuse area is disposed adjacent to the column decoders. In the column fuse area, there are formed fuses in which defective column addresses are stored.

As described above, in case it is assumed that, in the 64-Mbit memory cell array, 200 (on the average) memory cells having retention defects exist, 14 redundancy elements (spare row decoders) must be provided for each 2 Mbit sub-array in order to obtain a manufacturing yield of 90%.

Accordingly, in the 2-Mbit sub-array, 128 row decoders and 14 redundancy row decoders are provided.

Further, to this example, to one row decoder, four rows (word lines) are connected. Therefore, in the 2 Mbit sub-array, 512 rows (word lines) and 14×4 (=56) spare rows are provided.

Ordinarily, in case defective rows (word lines) are replaced by spare rows, the replacement is carried out from row decoder to row decoder. In the case of this example, to one row decoder, four rows (word lines) are connected, so that four rows are replaced by four spare rows at one time.

In the 64-Mbit DRAM having a floor plan as shown in FIG. 1 and FIG. 2, the increased amount ΔS in size of the chip is evaluated in accordance with the following equation (3):

$$\Delta S = yi \times Ni \times X \quad (3)$$

wherein yi stands for the width (in the column direction) of one row decoder,

Ni stands for the number of spare row decoders in one block (8 sub-arrays), and

X stands for the length (in the row direction) of the chip.

According to the technique in 1996, yi is about 4.4 $\mu$m, X is about 11 mm, and Ni is 112 (14×8), so that, from the equation (3), the incresed amount ΔS in size of the chip becomes as follows:

$$\Delta S = 4.4 \ \mu m \times 112 \times 11,000 \ \mu m = 5.42 \ mm^2.$$

It is considered that, in case the retention interval t ri is set to 256 ms, as seen above, in order to reduce the power consumed when a refresh operation is executed, about 200 (on the average) retention-defective memory cells which each have a retention time less than 256 ms are produced. Further, in the DRAM having thirty-two 2 Mbit sub-arrays, in order to relieve 200 memory cells having retention defects, the total number of 448 redundancy elements (spare row decoders) must be provided. Due to this, in the case of the DRAM of a floor plan as shown in FIG. 1 and FIG. 2, the chip size is increased by about 5.42 mm$^2$.

FIG. 3 shows the redundancy elements disposed side by side with the respective sub-array.

As mentioned above, in the case of the conventional technique, memory cells having retention defects are relieved by redundancy elements. The redundancy elements each include a defective address memory, an address comparator, a spare row decoder and spare rows (spare cells, spare word lines).

The defective memories each store a defective row address therein and is comprised of, e.g. a laser-burnout fuse. In the case of this example, 128 row decoders are provided for one sub-array. Due to this, in order to specify one of the 128 ($2^7$) row decoders, a row address signal of 7 bits must be used.

Due to this, the defective address memories each need to have at least 7 fuses (one bit is stored by one fuse) so as to be able to store the 7-bit row address signal. In actuality, the defective address memories are each composed of 7 fuses for storing the defective row addresses therein and one enable fuse indicative of whether or not these 7 fuses are programmed.

In this way, in case one defective address memory is comprised of 8 fuses, the provision of 448×(7+1)=3,584 fuses becomes necessary for the 64-Mbit DRAM as a whole, since 448 redundancy elements exist therein.

According to the technique in 1996, the total area occupied by one laser-burnout fuse and the circuits accessory thereto is about 0.0005 mm$^2$. Therefore, the area occupied by the 3,584 fuses in the DRAM chip becomes:

$$\Delta S' = 0.0005 \times 3,584 = 1.792 \ mm^2.$$

If the increased area portion ΔS for the spare row decoders and the increased are portion ΔS' for the fuses are put together, then the total area increase of the DRAM chip becomes $$\Delta S + \Delta S' = 5.42 + 1.792 = 7.21 \ mm^2.$$

According to the technique in 1996, the chip size of a 64 Mbit DRAM which has no redundance circuit is about 75 mm$^2$.

Therefore, in the case where, in a 64-Mbit DRAM which has a memory array comprising a plurality of sub-arrays, retention defects of 200 bits on the average have occurred with reference to the memory capacity of 64 Mbits, if attempt is made to relieve the retention defects by the use of a redundancy circuit so as to achieve a manufacturing yield of 90%, then the chip size becomes larger by about 9.6% than (75+7.21)/75=1.096 which is the chip size of a DRAM having no redundancy circuit.

However, this value is based on the presupposition that the defective memory cells are relieved by the use of only spare rows. In the case of relieving defective cells by the use of spare columns, the same thing is naturally applicable, too.

In the above, description has been made on the reduction in power consumption of a DRAM chip and the increase in retention-defective memory cells resulting therefrom and on the relief of retention-defective memory cells by means of redundancy elements and the resulting increase in size of the chip.

Next, other problematic points of the conventional DRAMs will be described below.

Referring to the redundancy circuit shown in FIG. 3, in case a memory cell having a retention defect has been detected through a memory cell test, the row address of the defective memory cell is programmed in a defective address memory (fuse array) by laser burnout.

An external row address signal is applied through a row address input circuit and, as a result, rendered into an internal row address, signal, which is fed to a row address multiplexer. A refresh row address signal used at the time of a refresh operation is produced by a refresh counter. The row address multiplexer outputs the internal row address signal or the refresh row address signal.

In each redundancy element, the address comparator makes a comparison between the address signal programmed in the defective address memory and the address signal outputted from the row address multiplexer.

In case the two signals have turned out to coincide with each other, a coincidence signal A becomes "H" in level, which makes the spare row decoder active. The spare row decoder applies a high potential to the spare word lines. A non-coincidence signal B becomes "L" in level, which makes the row decoder inactive. In case the two signal compared have turned out not to be coincident with each other, the coincidence signal A becomes "L" in level, which makes the spare row decoder inactive. The spare row decoder, then, applies no high potential to the spare word lines.

In case, in all the redundancy elements, the two address signals compared have turned out not to be coincident with each other, the non-coincidence signal B becomes "H" in level, which makes the row decoders active. That is, the non-coincidence signal B is set, by a precharge circuit, to "H" at the beginning, but in case the two address signals in at least one redundancy element have burned out to be coincident with each other, the non-coincidence signal B is changed from "H" to "L" in level by discharge.

In the redundancy circuit shown in FIG. 3, one address comparator is disposed in each redundancy element. Therefore, on the chip, a very long row address line C must be formed to feed the row address signal to the address comparator in each redundancy element.

Due to this, the load capacity of the row address line C is increased by the number of address comparators, and thus, a long time must be spent for transmitting the address signal to all the row decoders. Further, a very large power is consumed for charging and discharging of the row address line C, so that the power consumption of the DRAM chip as a whole is increased.

The matters mentioned above will be summed up as follows:

(1) If, in order to achieve a low power consumption at the time of a refresh operation, the refresh interval t ri is increased, then some of the memory cells which have so far been normal come to have retention defects.

(2) In case memory cells which have retention defects are relieved by the use of redundancy elements, redundancy elements which are larger in number than the redundancy elements in an ordinary DRAM must be provided in the chip. Due to this, the size of the chip is increased by an amount corresponding to the increased redundancy elements.

(3) In case the memory cell array is comprised of a plurality of sub-arrays, redundancy elements are provided for each sub-array. In this case, the relief efficiency in relieving defective memory cells (including the memory cells having retention defects) is lower than the relief efficiency of a DRAM which does not have such sub-arrays.

(4) The row address line is connected not only to the row decoder but also to the address comparators equal in a number to the redundancy elements at the row side. As a result, the load capacity of the row address line is increased, thus resulting in a delay of the row address signals. This same thing applies also to the column address line.

(5) The power consumed by the row (or column) address line is increased for the same reason as described in the foregoing Item (4).

BRIEF SUMMARY OF THE INVENTION

It is the object of the present invention to relieve memory cells having retention defects by the use of a technique other than the redundancy technique to thereby eliminate the increase in size of the chip and the delay in transmission of the address signals, whereby the reduction in power consumption at the time of a refresh operation and the enhancement in manufacturing yield can be realized.

The dynamic random access memory according to the present invention comprises a memory cell array including 1st, 2nd, . . . $2^n$-th (wherein n stands for a natural number) sub-arrays, a refresh counter which produces an n-bit sub-array selection signal for selecting one of the 1st, 2nd, . . . $2^n$-th sub-arrays and a row address signal for selecting one of a plurality of rows in the respective sub-arrays, when refresh is executed, and a refresh row address signal generator for converting the sub-array selection signal to a new sub-array selection signal for selecting the m-th (wherein m stands for 1, 2, . . . or $2^n$) sub-array and the k-th (wherein k stands for 1, 2, . . . or $2^n$, and k≠m) sub-array at the same time, when the m-th sub-array includes a defective row having a retention-defective memory cell and when the sub-array selection signal selects the k-th sub-array and the row address signal coincides with the row address signal of the defective row.

The dynamic random access memory according to the present invention comprises a memory cell array including 1st, 2nd, . . . $2^n$-th (wherein n stands for a natural number) sub-arrays, a refresh counter which produces an n-bit sub-array selection address signal for selecting one of the 1st, 2nd, . . . $2^n$-th sub-arrays and a row address signal for selecting one of a plurality of rows in the respective sub-arrays, when refresh is executed, and a refresh row address signal generator for converting the sub-array selection signal to a new sub-array selection signal for selecting the m-th (wherein m stands for 1, 2, . . . or $2^n$) sub-array and the k-th (wherein k stands for 1, 2, . . . or $2^n$, and k≠m) sub-array at the same time, when the m-th sub-array includes a defective row having a retention-defective memory cell which has a retention time less than a refresh interval t ri and longer than $1/2^n$ of the refresh interval t ri and when the sub-array selection signal selects the k-th sub-array and the row address signal coincides with the row address signal of the defective row.

The defective row is repeatedly selected at an interval $1/2^n$ of the refresh interval t ri, and the rows other than the defective row are repeatedly selected at the refresh interval t ri.

The dynamic random access memory according to the present invention comprises a memory cell array including 1st, 2nd, . . . $2^n$-th (wherein n stands for a natural number) sub-arrays, a refresh counter which produces an n-bit sub-array selection signal for selecting one of the 1st, 2nd, . . . $2^n$-th sub-arrays and a row address signal for selecting one of a plurality of rows in the respective sub-arrays, when refresh is executed, and a refresh row address signal generator for converting the sub-array selection signal to a first new sub-array selection signal for selecting the m-th (wherein m stands for 1, 2, . . . or $2^n$) sub-array and the k-th (wherein k stands for 1, 2, . . . or $2^n$, and k≠m) sub-array at the same time, when the m-th sub-array includes a first defective row having a first retention-defective memory cell which has a retention time less than a refresh interval t ri and longer than ½ of the refresh interval t ri and when the sub-array selection signal selects the k-th sub-array and the row address signal coincides with the row address signal of the first defective row, and for converting the sub-array selection signal to a second new sub-array selection signal for selecting the p-th (wherein p stands for 1, 2, . . . or $2^n$) sub-array and the q-th (wherein q stands for 1, 2, . . . or $2^n$, and q≠p) sub-array at the same time, when the p-th sub-array includes a second defective row having a second retention-defective memory cell which has a retention time less than ½ of the refresh interval t ri and longer than ¼ of the refresh interval t ri and when the sub-array selection signal selects the q-th sub-array and the row address signal coincides with the row address signal of the second defective row.

The first defective row is repeatedly selected at an interval ½ of the refresh interval t ri, the second defective row is repeatedly selected at an interval ¼ of the refresh interval t ri, and the rows other than the defective rows are repeatedly selected at the refresh interval t ri.

The dynamic random access memory according to the present invention comprises a memory cell array including 1st, 2nd, . . . $2^n$-th (wherein n stands for a natural number) sub-arrays, a refresh counter which produces an n-bit sub-array selection signal for selecting one of the 1st, 2nd, . . . $2^n$-th sub-arrays and a row address signal for selecting one of a plurality of rows in the respective sub-arrays, when refresh is executed, and a refresh row address signal generator for converting the sub-array selection signal to a first new sub-array selection signal for selecting the m-th (wherein m stands for 1, 2, . . . or $2^n$) sub-array and the k-th (wherein k stands for 1, 2, . . . or $2^n$, and k≠m) sub-array at the same time, when the m-th sub-array includes a first defective row having a first retention-defective memory cell which has a retention time less than a refresh interval t ri and longer than ½ of the refresh interval t ri and when the sub-array selection signal selects the k-th sub-array and the row address signal coincides with the row address signal of the first defective row, and for converting the sub-array selection signal to a second new sub-array selection signal for selecting the p-th (wherein p stands for 1, 2, . . . or $2^n$) sub-array and the q-th (wherein q stands for 1, 2, . . . or $2^n$, and q≠p) sub-array at the same time, when the p-th sub-array includes a second defective row having a second retention-defective memory cell which has a retention time less than ½ of the refresh interval t ri and longer than ¼ of the refresh interval t ri and when the sub-array selection signal selects the q-th sub-array and the row address signal coincides with the row address signal of the second defective row, and for converting the sub-array selection signal to a third new sub-array selection signal for selecting the x-th (wherein x stands for 1, 2, . . . or $2^n$) sub-array and the y-th (wherein y stands for 1, 2, . . . or $2^n$, and y≠x) sub-array at the same time, when the x-th sub-array includes a third defective row having a third retention-defective memory cell which has a retention time less than ¼ of the refresh interval t ri and longer than ⅛ of the refresh interval t ri and when the sub-array selection signal selects the y-th sub-array and the row address signal coincides with the row address signal of the third defective row.

The first defective row is repeatedly selected at an interval ½ of the refresh interval t ri, the second defective row is repeatedly selected at an interval ¼ of the refresh interval t ri, the third defective row is repeatedly selected at an interval ⅛ of the refresh interval t ri and the rows other than the defective rows are repeatedly selected at the refresh interval t ri.

The dynamic random access memory according to the present invention comprises a memory cell array including 1st, 2nd, . . . $2^n$-th (wherein n stands for a natural number) sub-arrays, a refresh counter which produces an n-bit sub-array selection signal for selecting one of the 1st, 2nd, . . . $2^n$-th sub-arrays and a row address signal for selecting one of a plurality of rows in the respective sub-arrays, when refresh is executed, and a refresh row address signal generator for converting the sub-array selection signal to a first new sub-array selection signal for selecting the m-th (wherein m stands for 1, 2, . . . or $2^n$) sub-array and the k-th (wherein k stands for 1, 2, . . . or $2^n$, and k≠m) sub-array at the same time, when the m-th sub-array includes a first defective row having a first retention-defective memory cell which has a retention time less than a refresh interval t ri and longer than ½ of the refresh interval t ri and when the sub-array selection signal selects the k-th sub-array and the row address signal coincides with the row address signal of the first defective row, and for converting the sub-array selection signal to a second new sub-array selection signal for selecting the p-th (wherein p stands for 1, 2, . . . or $2^n$) sub-array and the q-th (wherein q stands for 1, 2, . . . or $2^n$, and q≠p) sub-array at the same time, when the p-th sub-array includes a second defective row having a second retention-defective memory cell which has a retention time less than ½ of the refresh interval t ri and longer than ¼ of the refresh interval t ri and when the sub-array selection signal selects the q-th sub-array and the row address signal coincides with the row address signal of the second defective row, a nd for converting the sub-array selection signal to a third new sub-array selection signal for selecting the x-th (wherein x stands for 1, 2, . . . or $2^n$) sub-array and the y-th (wherein y stands for 1, 2, . . . or $2^n$, and y≠x) sub-array at the same time, when the x-th sub-array includes a third defective row having a third retention-defective memory cell which has a retention time less than $½^{n-1}$ of the refresh interval t ri and longer than $½^n$ of the refresh interval t ri and when the sub-array selection signal selects the y-th sub-array and the row address signal coincides with the row address signal of the third defective row.

The first defective row is repeatedly selected at an interval ½ of the refresh interval t ri, the second defective row is repeatedly selected at an interval ¼ of the refresh interval t ri, the third defective row is repeatedly selected at an interval $½^n$ of the refresh interval t ri, and the rows other than the above-mentioned defective rows are repeatedly selected at the refresh interval t ri.

Additional objects an d advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 7 is a schematic diagram showing the retention defect address memory shown in FIG. 6;

FIG. 9 is a schematic diagram showing how the address signal A <11>–A <0> changes;

FIG. 10 is a schematic diagram showing how the address signal A <11>–A <0> changes;

FIG. 16 is a schematic diagram explaining the principle underlying the case where two sub-arrays are provided;

FIG. 17A and FIG. 17B are schematic diagrams explaining the principle underlying the case where four sub-arrays are provided;

FIG. 18A, FIG. 18B and FIG. 18C are schematic diagrams explaining the principle underlying the case where eight sub-arrays are provided;

DETAILED DESCRIPTION OF THE INVENTION

Figure 1:
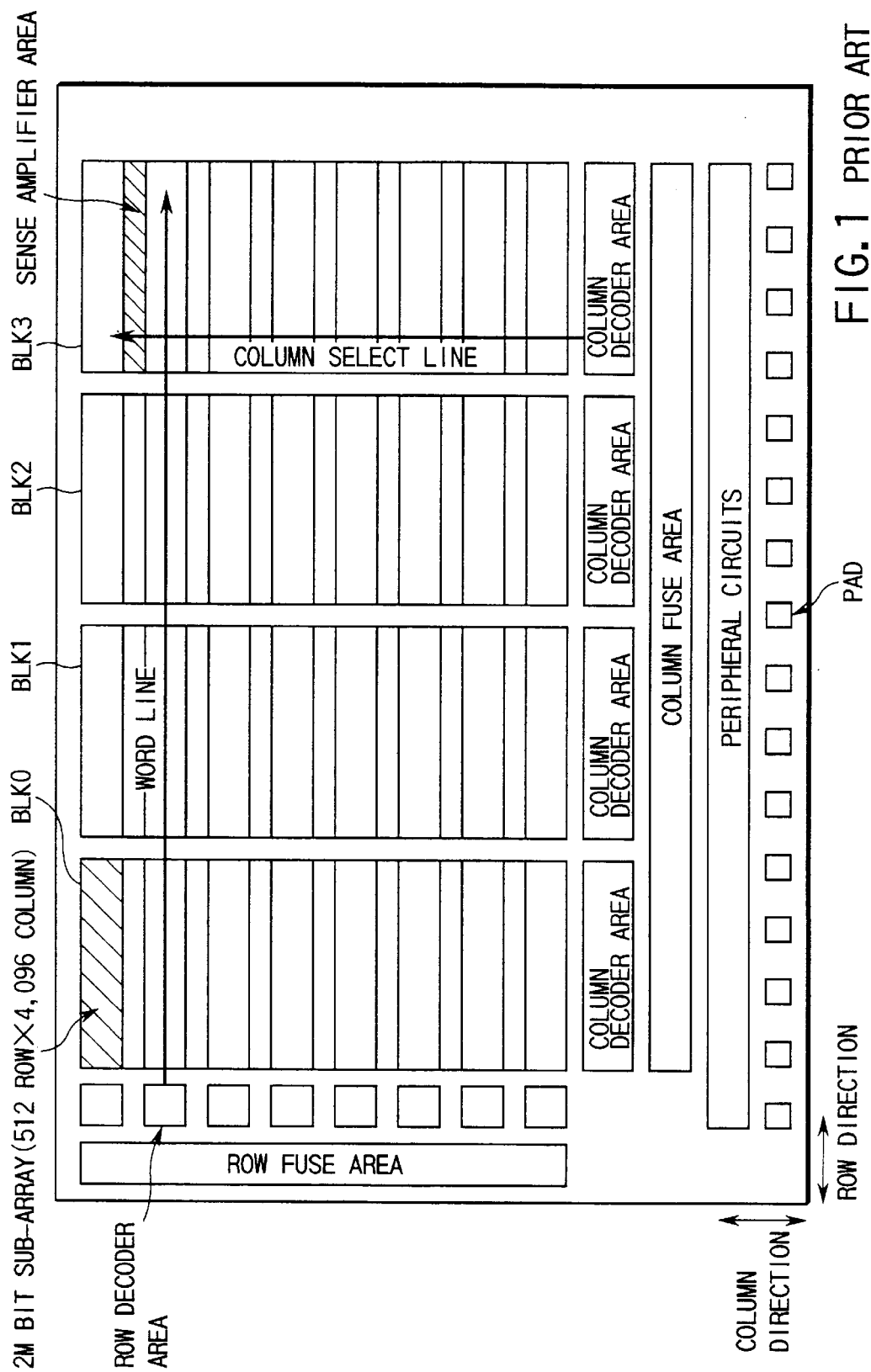
FIG. 1 is a schematic diagram showing an example of the floor plan of a conventional DRAM.
Figure 2:
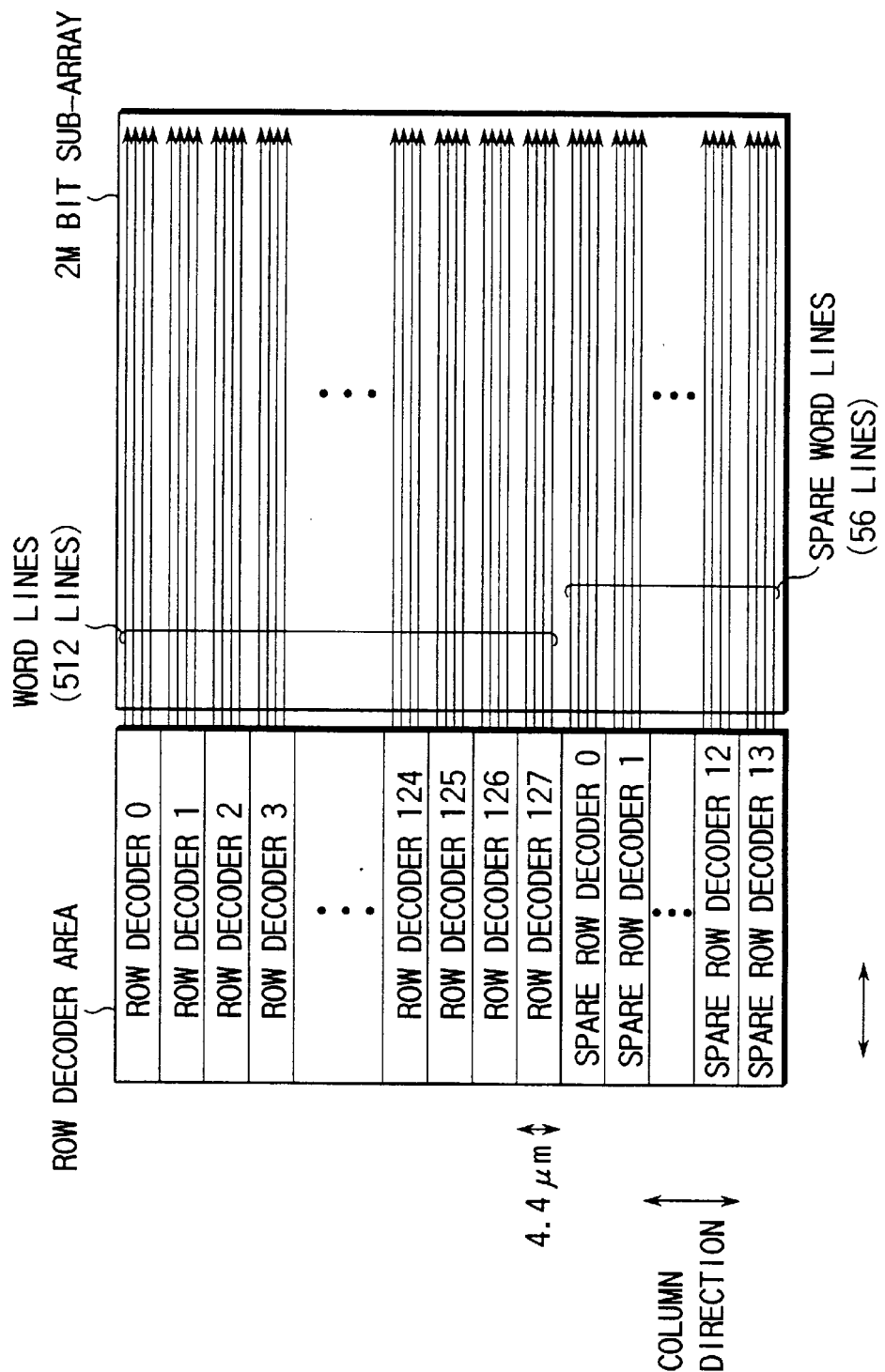
FIG. 2 is a schematic diagram showing the row decoder portion of FIG. 1.
Figure 3:
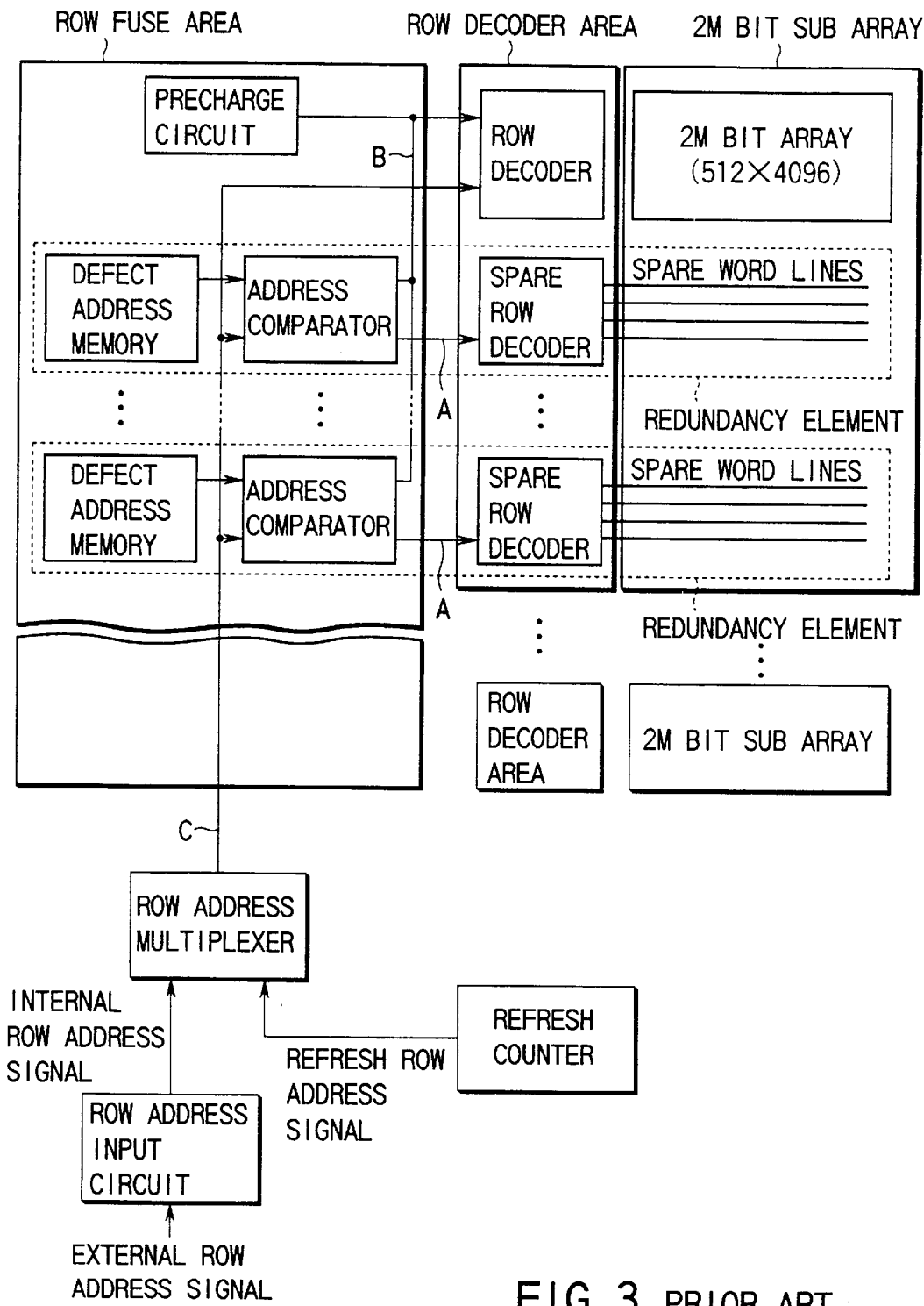
FIG. 3 is a schematic diagram showing the signal paths of the row address signals in the DRAM shown in FIG. 1.

The dynamic random access memory according to the present invention will now be described, referring to the drawings.

Figure 4:
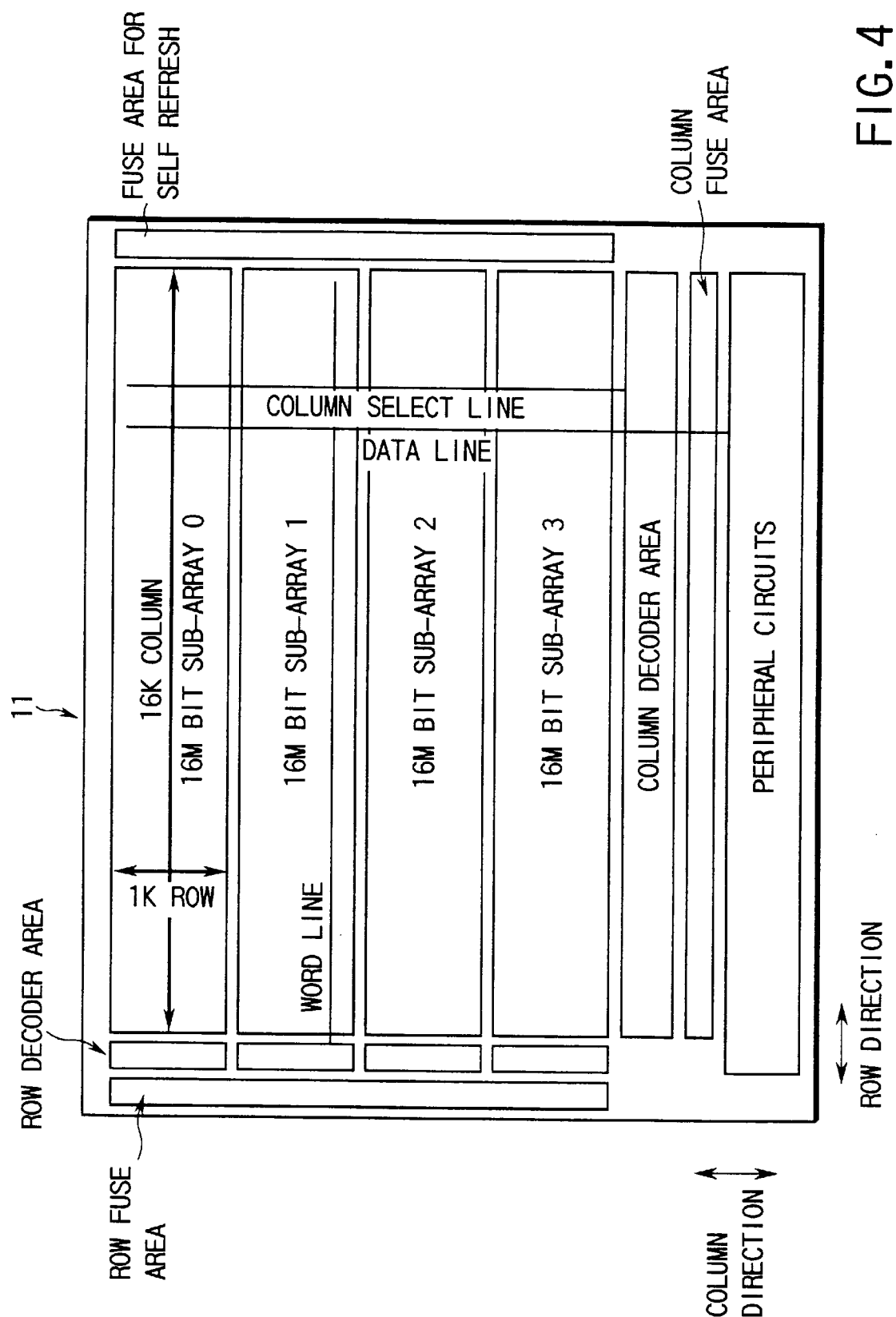
FIG. 4 is a schematic diagram showing an embodiment of the floor plan of the DRAM according to the present invention.

FIG. 4 shows an embodiment of the floor plan of the 64-Mbit DRAM according to the present invention.

According to this embodiment, the memory cell array is comprised of four sub-arrays 0 to 3 disposed in the column direction. The sub-arrays 0 to 3 each have a memory capacity of 16 Mbits. Each sub-array has 1,024 (1K) rows (word lines) and 16,384 (16K) columns. In the respective sub-arrays 0 to 3, sense amplifiers and column select switches are disposed.

Row recorder areas are disposed at one-end side, in the row direction, of the sub-arrays 0 to 3. The word lines extend from the row decoder areas towards the other end side, in the row direction, of the sub-arrays 0 to 3. A row fuse area is disposed adjacent to the row recorders. In the row fuse area, there are formed fuses for storing defective row addresses therein.

A column decoder area is disposed at one-end side, in the column direction, of the respective sub-arrays 0 to 3. Column select lines extend from the column decoder area towards the other end side, in the column direction, of the sub-arrays 1 to 3. A column fuse area is disposed adjacent to the column decoders. In the column fuse area, there are formed fuses for storing defective column addresses therein.

Peripheral circuits are disposed at one-end side, in the column direction, of the respective sub-arrays 0 to 3. The peripheral circuits includes various circuits such as a data input/output circuit, an address input circuit, a refresh counter, etc. Data lines extend from the peripheral circuits towards the other end in the column direction.

A fuse area for self-refresh is disposed along one side of the chip. This fuse area is an area peculiar to the present invention. Stored in the fuses in this area are defective row addresses including memory cells which have retention defects.

In this example, the fuse area for self-refresh is disposed along one side of the chip, but this area may alternatively be disposed on any part of the chip, it is because the signal delay matters very little.

In the DRAM which is constituted as described above, the total number of rows in the four sub-arrays is 1,024 (the number of rows in one sub-array) 4 (the number of sub-arrays)=4,096. Therefore, in order to select one out of these 4,096 ($2^{12}$) rows (word lines) by means of the row decoder, a row address signal of 12 bits becomes necessary.

Here, it is to be assumed that the 12-bit row address signal is set to A <11>, A <10>, A <9>, A <8>, . . . A <2>, A <1> and A <0>, and the inverse signals thereof are set to BA <11>, BA <10>, BA <9>, BA <8>, . . . BA <2>, BA <1> and BA <0>.

Figure 5:
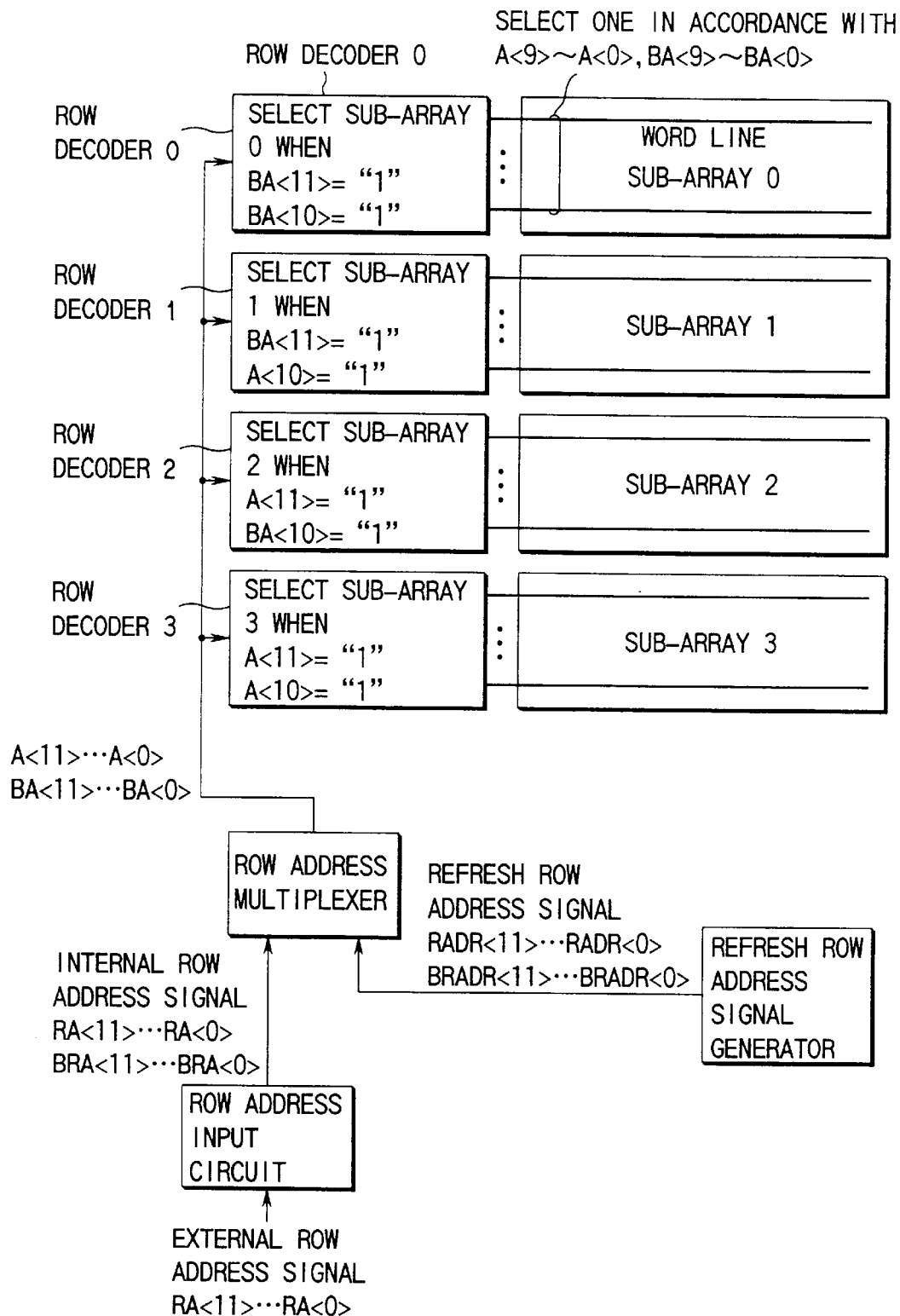
FIG. 5 is a schematic diagram showing the signal paths of the row address signals in the DRAM shown in FIG. 4.

FIG. 5 shows an outline of the transmission path of the 12-bit row address signal in the DRAM chip.

An external address signal RA <11>, RA <10>, . . . RA <0> is inputted into an row address input circuit from outside the chip. The row address input circuit outputs the external row address signal RA <11>, RA <10>, . . . RA <0> and their inverse signal BRA <11>, BRA <10>, . . . BRA <0>.

A refresh row address signal generator is an important constitutional element of the present invention. The refresh row address signal generator outputs a refresh row address signal RADR <11>, RADR <10>, . . . RADR <0> and their inverse signals BRADR <11>, BRADR <10>, . . . BRADA <0>.

A row address multiplexer selects one of the internal row address signal and the refresh row address signal and feeds the thus selected signal to four row decoders 0 to 3 as a row address signal A <11>, A <10>, . . . A <0>, BA <11>, <10>, . . . BA <0>. The four row decoders 0 to 3 are provided corresponding to the four sub-arrays 0 to 3.

Of the 12-bit row address signal, the bits A <11> and A <10> at the high-order side and their inverse signals BA <11> and BA <10> are used for selection of the sub-arrays 0 to 3.

For instance, the row decoder 0 selects the sub-array 0 when BA <11> and BA <10> are both alike "1". At this time, the row decoder 0 selects one of the 1,024 rows (word lines) in the sub-array 0 on the basis of the 10-bit row address signal at the lower-order side, that is, A <9>, A <8>, . . . A <0>, BA <9>, BA <8>, . . . BA <0>.

The row decoder 1 selects the sub-array 1 when BA <11> and BA <10> are both alike "1". At this time, the row decoder 1 selects one of the 1,024 rows (word lines) in the sub-array 1 on the basis of the lower-order 10-bit row address signal A <9>, A <8>, . . . A <0>, and BA <9>, BA <8>, . . . <0>.

The row decoder 2 selects the sub-array 2 when A <11> and BA <10> are both alike "1". At this time, the row decoder 2 selects one of the 1,024 rows (word lines) in the sub-array 2 on the basis of the lower-order 10-bit row address signal A <9>, A <8>, . . . A <0>, and BA <9>, BA <8>, . . . BA <0>.

The row decoder 3 selects the sub-array 3 when A <11> and A <10> are both alike "1". In this case, the row decoder 3 selects one of the 1,024 rows (word lines) on the basis of the lower-order 10-bit row address signal A <9>, A <8>, . . . A <0>, BA <9> and BA <8>, . . . BA <0>.

Table 1 shows the relationship between the values of A <11>, A <10> BA <11> and BA <10> and the sub-arrays selected.

TABLE 1

| A <11> | BA <11> | A <10> | BA <10> | Sub-array selected |
|---|---|---|---|---|
| 0 | 1 | 0 | 1 | 0 |
| 0 | 1 | 1 | 0 | 1 |
| 1 | 0 | 0 | 1 | 2 |
| 1 | 0 | 1 | 1 | 3 |

When an ordinary operation (writing, reading) is performed, one of the four sub-arrays 0 to 3 is selected on the basis of the external row address signal.

When a refresh operation is performed, one of the four sub-arrays 0 to 3 is selected in principle on the basis of the refresh row address signal as when an ordinary operation is carried out.

However, in the present invention, a special case is presupposed as mentioned below.

That is, when a previously set condition is satisfied, RADR <11> and BRADR <11>—of the refresh row address signal—are both alike brought into the state of "1".

The "previously set condition" mentioned above will be described in detail later, but, here, briefly speaking, it refers to the case where the refresh row address coincides with the address stored in a retention defect address memory. The retention defect address memory mentioned above is provided in the refresh row address signal generator and is one important constitutional element of the present invention.

When RADR <11> and BRADR <11> are both alike "1", A <11> and BA <11> both alike become "1", so that, of the four sub-arrays 0 to 4, two are selected by the sub-array select address A <11>, BA <11>, A <10> and BA <10>.

As shown in Table 2, according to the present invention, there are two patterns, that is, the case where the sub-arrays 0 and 2 are selected at the same time, and the case where the sub-arrays 1 and 3 are selected at the same time.

TABLE 2

| A <11> | BA <11> | A <10> | BA <10> | Sub-array selected |
|---|---|---|---|---|
| 1 | 1 | 0 | 1 | 0, 2 |
| 1 | 1 | 1 | 0 | 1, 3 |

The fact that two sub-arrays are selected means that the refresh interval t ri in the refresh operation becomes half for those memory cells which have retention defects. Due to this, those memory cells which have retention defects can be relieved not by the use of the redundancy circuit. This point will be described in more detail later.

Figure 6:
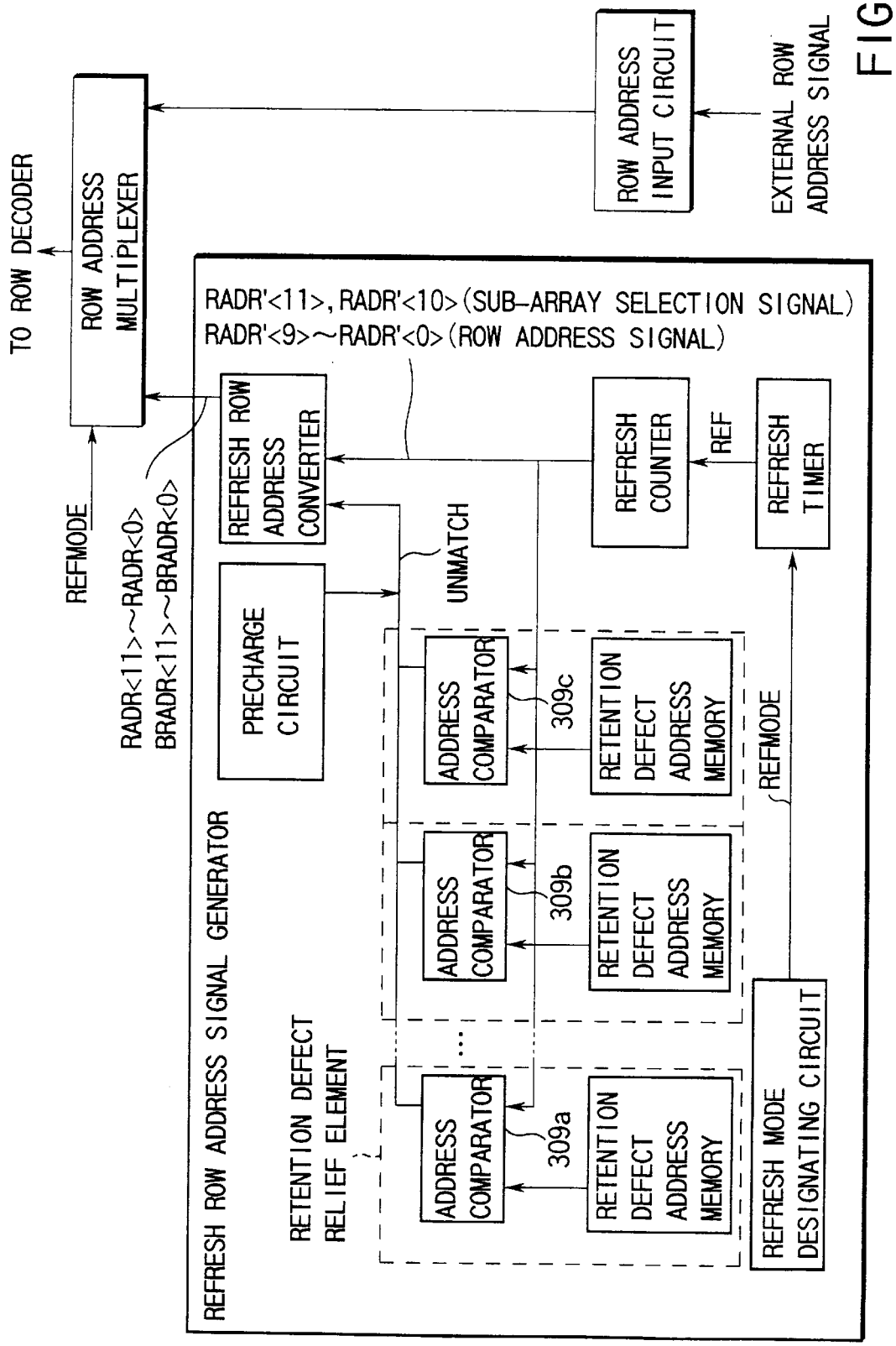
FIG. 6 is s schematic diagram showing a first embodiment of the refresh row address signal generator shown in FIG. 5.

FIG. 6 shows a first embodiment in structural arrangement of the refresh row address signal generator shown in FIG. 5.

In this embodiment, it is to be assumed that the refresh cycle C is 4,096, the refresh period t rp is 62.5 $\mu$s, and the refresh interval t ri is 256 ms (62.5 $\mu$s×4,096).

A refresh mode designation circuit renders a signal REFMOPDE into "H" in level when the refresh mode is started. The signal REFMODE is fed to a refresh timer. The refresh timer is made active when the signal REFMODE becomes "H" in level, and the refresh timer outputs a pulse signal REF every 62.5 $\mu$s.

The pulse signal REF is fed to a refresh counter. The refresh counter is a 12-bit binary counter. Thus, the initial value of the refresh counter is "000000000000". When the first pulse signal REF is inputted to the refresh counter, the count value of the refresh counter becomes "000000000001".

Every time the pulse signal REF is inputted to the refresh counter, the value of the refresh counter is incremented by 1. If, when the count value of the refresh counter has become "111111111111", the pulse signal REF is inputted to the refresh counter, then the count value of the refresh counter returns to "000000000000".

The count value of the refresh counter directly becomes a refresh row address signal RADR'<11>–RADR' <0> and is fed to a refresh row address converter and a plurality of retention defect elements.

The 0 refresh row address converter produces a refresh row address signal RADR <10>–RADR <0> and its inverse signal thereof BRADR <10>–BRADR <0> on base of refresh row address signal RADR' <10>–RADR'<0>. The refresh row address signal RADR <10>–RADR <0> has the same value (logic value) as the refresh row address signal RADR' <10>–RADR'<0>.

Further, the refresh row address converter produces refresh row address signal RADR <11> and BRADR <11> on the basis of the refresh row address signal RADR' <11>. In principle, the signal RADR <11> has the same value (logic value) as the signal RADR' <11>, and the signal BRADR <11> is the inverse signal of the signal RADR <11>.

However, according to the present invention, when a signal UNMATCH is "L" in level, the refresh row address signals RADR <11> and BRADR <11> are both alike made into the state of "1" regardless of the value of the refresh row address signal RADR' <11>.

The retention defect relieving elements are each comprised of a retention defect address memory and an address comparator. The retention defect address memories each store therein the row address resulting from inverting the most significant bit of the row address of a memory cell which has a retention defect.

In this embodiment, the refresh interval t ri is 256 ms, so that a memory cell which has a retention time longer than 128 ms (half of t ri) and shorter than 256 ms is regarded as a memory cell having a retention defect.

The output signal from the respective retention defect address memory is fed to the address comparator. The address comparator compares the count value of the refresh counter with the output signal from the retention defect address memory. The output ends of the address comparators are connected to a precharge circuit. The precharge circuit previously sets the output ends of the address comparators at "H" in level.

In case the result of the comparison made by the respective address comparator turns out to be "coincidence", that is, in case the count value of the refresh counter and the output signal from the retention defect address memory coincide with each other, the output end of the address comparator changes into "L" in level; and thus, the signal UNMATCH becomes "L". In this case, the refresh row address converter renders the refresh row address signals RADR <11> and BRADR <11> both alike into the sate of "1".

In case the rebuilt of the comparison made by the respective address comparator has turned out to be "non-coincidence", that is, in case the count value of the refresh counter and the output signal from the retention defect address memory do not coincide with each other, the output end of the address comparator is maintained at "H" in level. Thus, the signal UNMATCH becomes "H" in level. In this case, the refresh row address converter outputs the refresh row address signal RADR <11> and its inverse signal BRDR <11>.

A row address multiplexer selects the output signal from the refresh row address converter, that is, the refresh row address signals RADR <11>–RADR <0> and BRADR <11>–BRADR <0>.

FIG. 7 shows the size (capacity) of the respective retention defect address memory shown in FIG. 6.

The retention defect address memory is comprised of an ERROM, fuses or the like. The retention defect address memory for one set stores therein a row address of 12 bits and one enable bit, totaling 13 bits. Therefore, in case n sets of retention defect relief elements are provided in the chip, the retention defect address memory is required to have a capacity of (13×n) bits.

For instance, in case it is presumed that the number of memory cells which have retention defects will not exceed 200, it is sufficient to prepare 200 sets of retention defect relief elements. In this case, the capacity of the retention defect address memories amounts to 2,600 bits in total.

Figure 8:
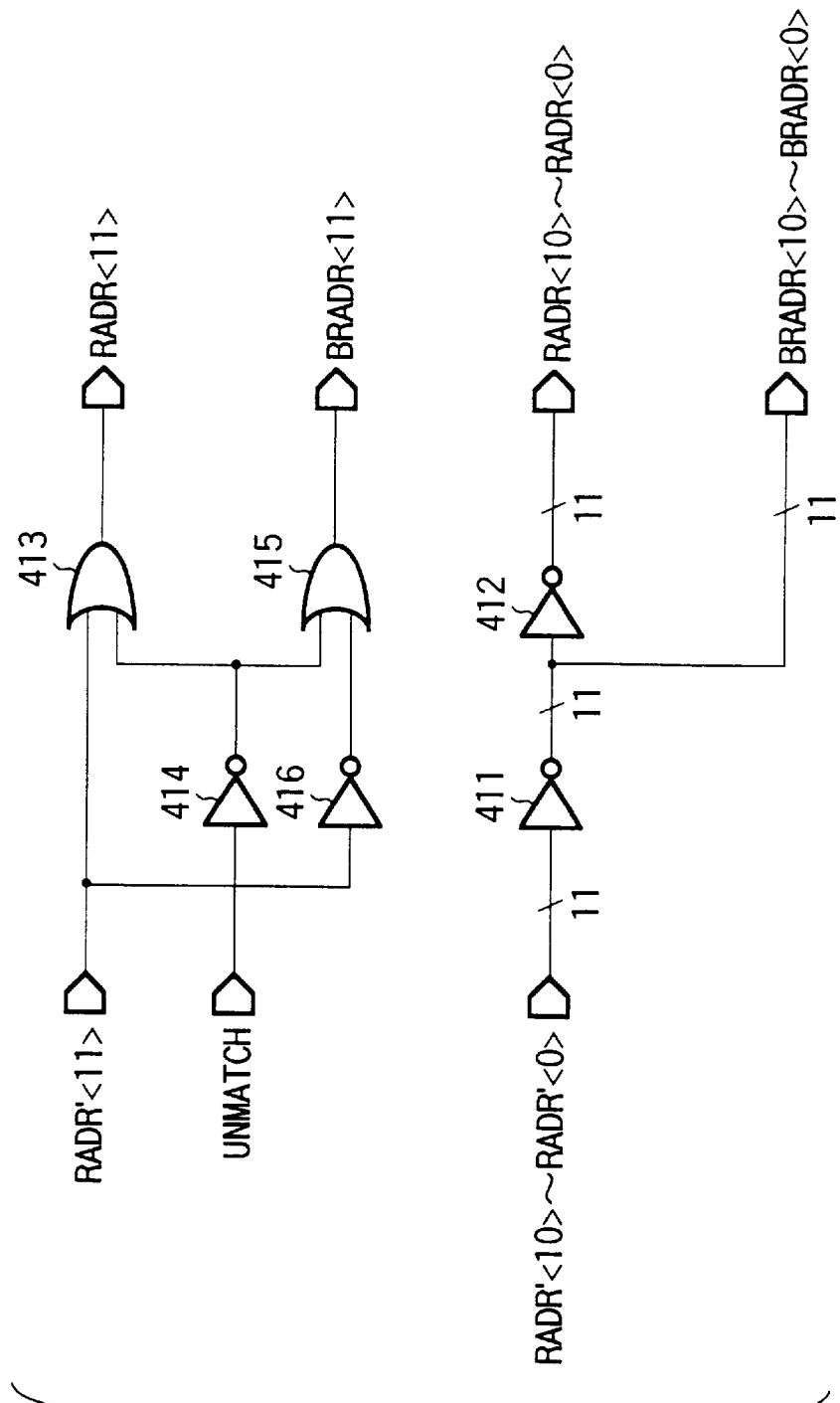
FIG. 8 is a schematic diagram showing the refresh row address converter shown in FIG. 6.

FIG. 8 shows the constitutional arrangement of the refresh row address signal converter shown in FIG. 6.

When the refresh row address signals RADR' <10>–RADR' <0> pass through inverters 411 and 412, the signals are changed into the refresh row address signals RADR <10>–RADR <0>. Further, when the refresh row address signals RADR' <10>–RADR' <0> pass through the inverter 411, the signals are changed into the refresh row address signals BRADR <10>BRADR <0>.

The refresh row address signal RADR' <11> is inputted to an OR circuit 413 and, at the same time, passes through an inverter 416 and is, then, inputted to an OR circuit 415. The signal UNMATCH passes through an inverter 414 and is then inputted to the OR circuits 413 and 415, respectively. The output signal from the OR circuit 413 becomes the refresh row address signal RADR 11, while the output signal from the OR circuit 415 becomes the refresh row address signal BRADR <11>.

In case, in one of all the retention defect relieving elements (n sets), the result of the comparison made by the address comparator turns out to be "coincidence", that is, in case the signal UNMATCH becomes "L" in level, the output signals from the OR circuits 413 and 415 always become "1". Therefore, the refresh row address signals RADR <11> and BRADR <11> both alike become "1" regardless of the value of the refresh row address signal RADR' <11>.

In case the results of the comparisons made by the address comparators in all the retention defect relieving elements (n sets) turn out to be "non-coincidence", that is, in case the signal UNMATCH becomes "H" in level, the output signal from the OR gate 413 assumes the same value (logic value) as the refresh row address signal RADR' <11>, and the output signal from the OR circuit 415 assumes the value (logic value) resulting from inversion of the refresh row address signal RADR' <11>. Thus, the refresh row address signals RADR <11> and BRADR <11> become complementary signals with respect to each other.

Next, the operation of the DRAM according to the present invention will be described.

First, a test will be made on the retention characteristics of all the memory cells. This test will be carried out when the device is in its wafer state.

First, it is tested whether or not there exists a memory cell whose retention time is less than ½ of the refresh interval t ri. In this case, those memory cells whose retention time is less than ½ of the refresh interval t ri are not relieved by the relief system according to the present invention.

However, as will be described in detail later, those memory cells which each have a retention time less than the refresh interval t ri and longer than $1/2^n$ (the maximum value of n being the number of sub-arrays in the column direction) of the refresh interval t ri can be relieved by the relief system according to the present invention.

The test of whether or not the retention time of each memory cell is less than ½ (128 ms) of the refresh interval t ri is carried as follows.

As shown in FIG. 9, the row address s signal is changed, so that data are successively written into all the memory cells in the sub-arrays 0 to 3. After this, the row address is changed, so that the data in all the memory cells in the sub-array 0 to 3 are successively read out. With reference to one memory cell, the length of time spent from the read-in of the data to the read-out thereof is ½ (128 ms) of the refresh interval t ri.

Concerning each of all the memory cells, comparison is made between the written data and red-out data to check whether they are coincident with each other. In case the data thus compared turn out to be coincident with each other, it is decided that the retention time is longer than ½ of the fresh interval t ri, while in case the data compared turn out to be not coincident with each other, it is decided that the retention time is less than ½ of the refresh interval t ri.

In the case of this test, it is to be assumed that, as a result of the tests conducted, all the memory cells have turned out to have a retention time longer than ½ (longer than 128 ms) of the refresh interval t ri.

Next, as shown in FIG. 10, a test will be carried out as to whether there exist memory cells which each have a retention time less than the refresh interval t ri. In this case, those memory cells which each have retention time longer than ½ of the refresh interval t ri and less than the refresh interval t ri are objects to be relieved.

The row address signal is changed, so that the data are successively written into all the memory cells in the sub-arrays 0 to 3. After this, the row address is changed, so that the data in all the memory cells in the sub-arrays 0 to 3 are successively read out. With reference to one memory cell, the length of time spent from the writing of the data to the reading thereof is the refresh interval t ri (256 ms).

Concerning each of all the memory cells, the written data and the read-out data are compared with each other to check whether or not they are coincident with each other. In case the both data compared have turned out to be coincident with each other, it is decided that the retention time is longer than the refresh interval t ri, while in case the data compared have turned out to be not coincident with each other, it is decided that the retention time is less than the refresh interval t ri.

It is to be assumed that, as a result of the test thus conducted, it has been found that there exists a memory cell whose retention time is longer than t ri/2 (128 ms) and shorter than t ri (256 ms), and that the row address A <11>–A <0> of the memory cell is "000000000001".

In this case, as shown in FIG. 7, in the retention defect address memory of the retention defect address memory of one specific retention defect relief element of the plurality of retention defect relief elements, the address "100000000001" obtained by inverting the most significant bit A <11> of the row address "000000000001" of the memory cell which has the retention defect is written. Further, the enable bit is set to "1" to validate the predetermined one retention defect relief element.

The reason why the address resulting from inverting the most significant bit A <11> of the row address of the memory cell having a retention defect is written into the retention defect address memory is as follows.

The main point of the present invention lies in that, to a retention-defective memory cell which has a retention time shorter than the ordinary refresh interval t ri, a refresh operation is effected at a refresh interval shorter than the ordinary refresh interval t ri.

The refresh row address is successively incremented from "000000000000" to "111111111111". That is, after the rows in the sub-array 0 are selected, the rows in the sub-array 1, the rows in the sub-array 2 and the rows in the sub-array 3 are selected in due order. Here, the defective row to which a memory cell having a retention defect belongs exists in the sub-array 0. In order to make, half the ordinary refresh interval t ri, the refresh interval of the memory cell connected to this defective row, it is sufficient to perform a fresh operation to the defective row in the sub-array 0 at the same time when the row in the sub-array 2 which row corresponds to the defective row in the sub-array 0 have been selected. Thus, to the retention-defective address, the address obtained by inverting the most significant bit A <11> of the sub-array selection address is written into the retention defect address memory.

When the refresh address signal is "100000000001", ordinarily only the sub-array 2 is selected. However, this refresh address signal coincides with the address stored in the retention defect address memory, so that RADR <11> and BRADR <11> both alike become "1", and thus, the sub-arrays 0 and 2 are selected at the same time. That is, in both of the sub-arrays 0 and 2, the rows whose address RADR <9> RADR <0> correspond to "000000000001" are selected at the same time.

Figure 11:
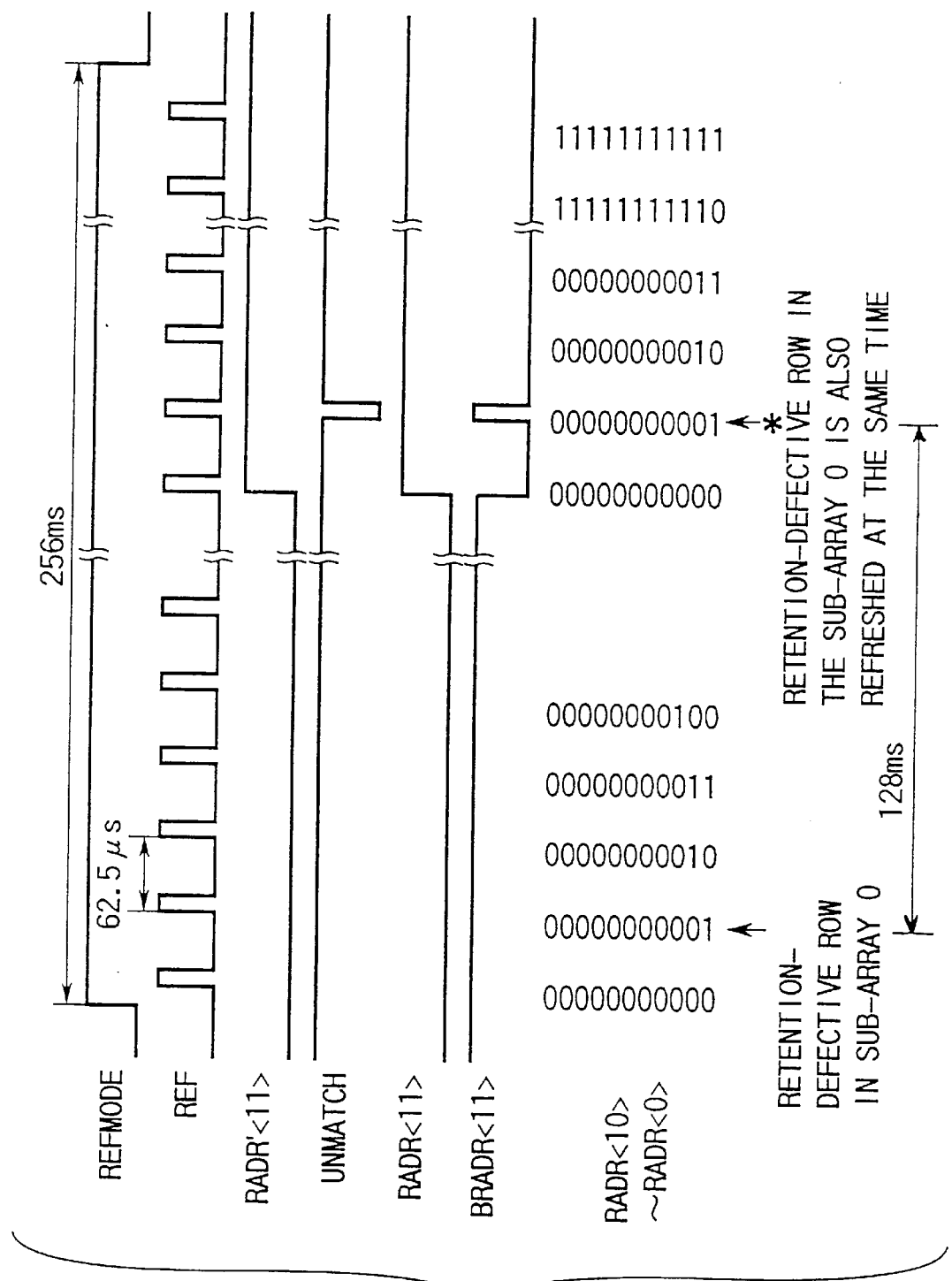
FIG. 11 is a waveform diagram showing the refresh operation performed in the system shown in FIG. 6.

As shown in FIG. 11, when the refresh mode is started, the refresh mode designating signal REFMODE becomes "H". in level. During the period over which the refresh mode designating signal REFMODE is "H" in level, a refresh timer outputs a refresh pulse signal REF every 62.5 $\mu$s. Every time the refresh pulse signal REF is outputted, the count value of the refresh counter is incremented by 1 from "000000000000" to "111111111111".

The memory cells a the row address corresponding to the count value of the refresh counter, that is, the refresh row address signals RADR <11>–RADR <0> and BRADR <11>–BRADR <0> are refreshed.

When the count value of the refresh counter is between "000000000000" and "001111111111", the sub-array 0 is selected, and the rows in the sub-array 0 are successively refreshed. When the count value is "000000000001", the row including the retention-defective memory cell in the sub-array 0 is refreshed.

When the count value of the refresh counter is between "010000000000" and "011111111111", the sub-array 1 is selected, so that the rows in the sub-array 1 are successively refreshed.

When the count value of the refresh counter is between "100000000000" and "101111111111", the sub-array 2 is selected, so that the rows in the sub-array 2 are successively refreshed. When the count value is "100000000001 ", this count value coincides with the address value in the retention defect address memory (FIG. 7), so that the result of the address comparison performed in the retention defect relief element turns out to be "coincidence", and thus, the signal UNMATCH becomes "L" in level.

In this case, RADR <11> and BRADR <11> both alike become "1", so that the sub-arrays 0 and 1 are selected at the same time. Thus, in the sub-arrays 0 and 2, the rows whose BRADR <9>–BRADR <0> are "000000000001" are refreshed at the same time.

When the count value of the refresh counter is between "110000000000" and "111111111111", the sub-array 3 is selected, so that the rows in the sub-array 3 are successively refreshed.

In this way, the rows which do not includes memory cells having retention defects are refreshed at the refresh interval t ri (256 ms), while, the rows including memory cells which have retention defects are refreshed at an interval (128 ms) ½ of the refresh interval t ri.

Therefore, according to the present invention, those retention-defective memory cells which each have a retention time less than the refresh interval t ri and longer than ½ of the refresh interval t ri can be relieved without using the redundancy circuit.

Further, since there is no necessity of relieving the retention-defective memory cells by the use of the redundancy circuit, the redundancy circuit can be reduced in size, and the spare decoders and the spare lines can also be reduced in number. Thus, the present invention can contribute to the reduction in size of the memory chip.

Further, those memory cells which have retention defects are refreshed at every 128 ms, but those memory cells which have no retention defect are refreshed at every 256 ms. That is, all the memory cells need not be refreshed at every 128 ms, so that the power consumption when refresh is performed can be reduced.

Further, the address comparators in the retention defect relief elements are connected to the refresh counter. That is, the signal line for transmitting the internal row address signal is connected to the row decoders and the comparators in the redundancy circuit which comparators are smaller in number than in the conventional case. Thus, the load capacity of this signal line can be reduced, and thus, high-speed access becomes possible.

FIG, 12 shows a second embodiment of the structural arrangement of the refresh row address signal generator shown in FIG. 5.

In this embodiment, it is to be assumed that the refresh cycle C is 4,096, the refresh period t rp is 62.5 $\mu$s, and the refresh interval is t ri is 256 ms (62.5 $\mu$s×4,096).

The refresh mode designating circuit makes the signal REFMODE "H" in level when the refresh mode is started. The signal REFMODE is fed to the refresh timer. The refresh timer becomes active when the signal REFMODE becomes "H" in level, thus outputting a pulse signal REF at every 62.5 $\mu$s.

The pulse signal REF is fed to the refresh counter. The refresh counter is a 12-bit binary counter. Thus, the initial value of the refresh counter is "000000000000". When the first pulse signal REF is inputted to the refresh counter, the count value of the refresh counter becomes "000000000001".

Every time the pulse signal REF is inputted to the refresh counter, the value of the refresh counter is incremented by 1. If, when the count value of the refresh is "111111111111", the pulse signal REF is inputted to the refresh counter, then the count value of the refresh counter returns to "000000000000".

The count value of the refresh counter directly becomes the refresh row address signal RADR' <11>–RADR' <0>, which is fed to the refresh row address converter and the address decoder.

The refresh row address converter produces the refresh row address signals RADR <10>–RADR <0> and their inverse signals BRADR <10>–BRADR <0> on the basis of the refresh row address signal RADR' <10>–RADR' <0>. The refresh row address signals RADR <10>–RADR <0> have the same values (logic values) as the refresh row address signal RADR' <10>–RADR' <0>.

Further, the refresh row address converter produces the refresh row address signals RADR <11> and BRADR <11> on the basis of the refresh row address signal RADR' <11>. In principle, the signal RADR <11> has the same value (logic value) as the signal RADR' <11>, and the signal BRADR <11> becomes the inverse signal of the signal RADR <11>.

However, according to the present invention, when the read signal read out by the read circuit is "H" in level, the refresh row address signals RADR <11> and the BRADR <11> are both alike brought into the state of "1" without regard to the value of the refresh row address signal RADR' <11>.

The refresh row address signal RADR' <10>–RADR' <0> is fed to the address decoder, and the refresh row address signal RADR' <11> is fed to the address decoder via an inverter.

The retention defect memory has a memory capacity of 4,096 bits corresponding to the total number (4,096) of rows in the sub-arrays 0 to 4. By the address decoder, the count value of the refresh counter is decoded to select one bit of the 4,096 bits in the retention defect memory.

In case there is a row including memory cells which have retention defects, such as, e.g. memory cells which each have a retention time longer than 128 ms and less than 256 ms, "1" is written into the bit of the predetermined retention defect memory. For instance, in case a memory cell having a retention defect is included in a row corresponding to the row address signal "000000000000", "1" is written into the bit corresponding to this row address signal (See FIG. 14).

A read circuit is a circuit for reading out the information written in the bit specified by the address inputted by the address decoder. For instance, when the count value of the refresh counter "000000000000", the address "100000000000" is inputted into the address decoder. The address decoder reads out the data in the bit corresponding to this address.

The read signal read out by the read circuit becomes "H" in level when the selected bit of the retention defect memory is "1" and becomes "L" in level when the selected bit of the retention defect memory is "0".

For instance, when the count value of the refresh counter is "100000000000", the address "000000000000" is inputted to the address decoder, so that the read signal becomes "H" in level. In this case, in the refresh row address converter, the refresh row address signals RADR <11> and BRADR <11> are both alike made into the sate of "1".

Thus, the sub-arrays 0 and 2 are selected, so that, in the respective sub-arrays 0 and 2, the rows whose row address signals RADR <9>–RADR <0> are "0000000000" are refreshed.

Figure 12:
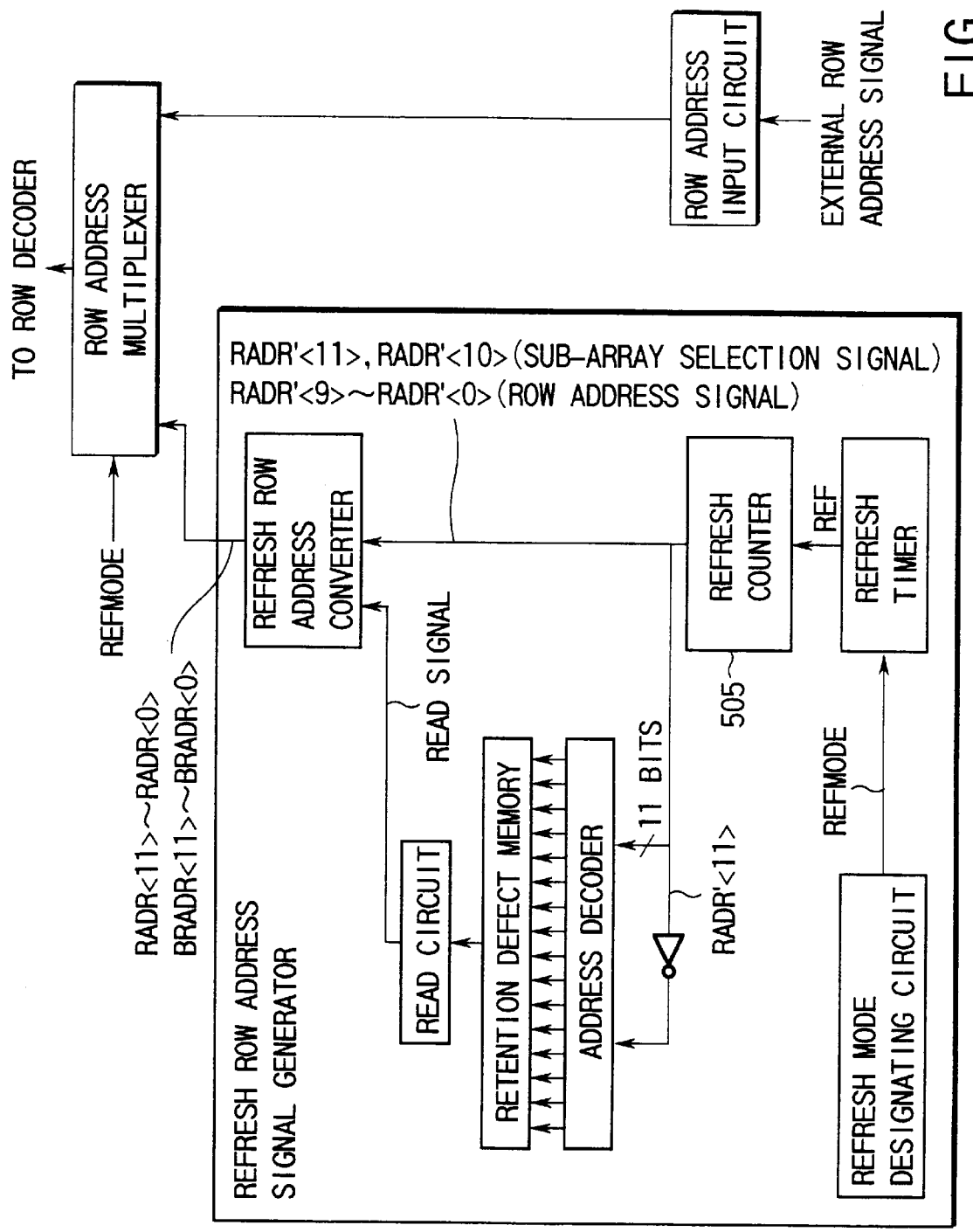
FIG. 12 is a schematic diagram showing a second embodiment of the refresh row address signal generator shown in FIG. 5.
Figure 13:
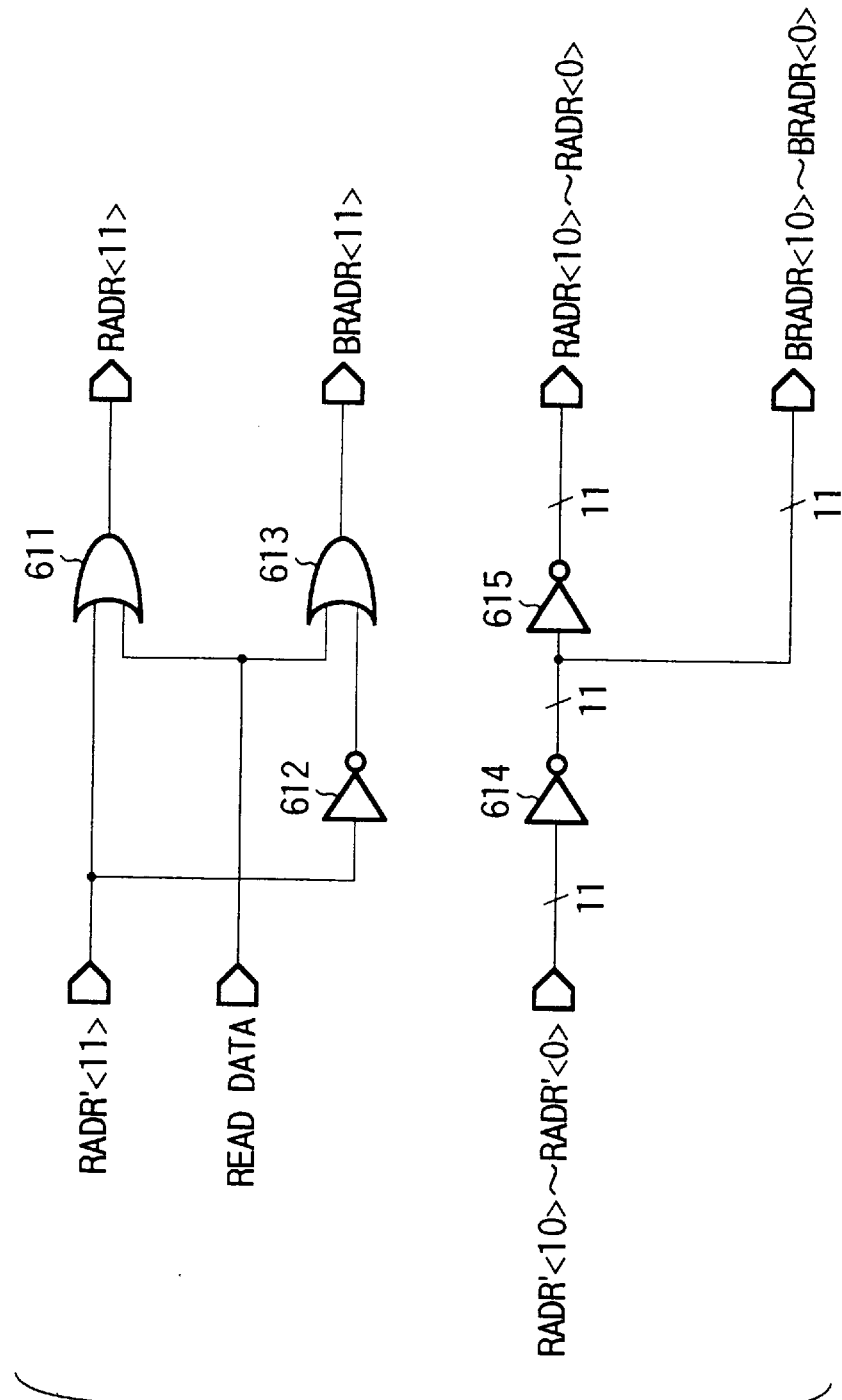
FIG. 13 is a schematic diagram showing the refresh row address converter shown in FIG. 12.

FIG. 13 shows the structure of the refresh row address signal converter shown in FIG. 12.

The refresh row address signal RADR' <10>–RADR' <0> passes through inverters 614 and 615, whereby the signal is changed into a refresh row address signal RADR <10>–RADR <0>. Further, the refresh row address signal RADR' <10>–RADR' <0> passes through the inverter 614, whereby the signal is changed into a refresh row address signal BRADR <10>–BRADR <0>.

The refresh row address signal RADR' <11> is inputted to an OR circuit 611 and, at the same time, made to pass through an inverter 612 and then inputted to the OR circuit 613.

The read signal is inputted to the OR circuits 611 and 613, respectively. The output signal from the OR circuit 611 is rendered into a refresh row address signal RADR <11>, and the output signal from the OR circuit 613 is rendered into a refresh row address signal BRADR <11>.

In case the read signal becomes "H" in level, the output signals from the OR circuits 611 and 613 always become "1". Therefore, the refresh row address signals RADR <11> and BRADR <11> both alike become "1" without regard to the value of the refresh row address signal RADR' <11>.

In case the read signal becomes "L" in level, the output signal from the OR circuit 611 assumes the same value (logic value) as the refresh row address signal RADR' <11>, and the output signal from the OR circuit 613 assumes the value (logic value) resulting from the inversion of the refresh row address signal RADR' <11>. Thus, the refresh row address signal RADR <11> and BRADR <11> turn out to be complementary signals.

Next, the operation of the DRAM according to the present invention will be described.

First, the retention characteristics of all the memory cells are tested. This test is carried when the device is in the state of a wafer.

First, it is tested whether or not there exist memory cells which each have a retention time less than ½ of the refresh interval t ri. In the case of this embodiment, those memory cells which each have a retention time less than ½ of the refresh interval t ri are not to be relieved by the relief system according to the present invention.

However, as will be described in detail later, those memory cells which each have retention time longer than ½$^n$ (where the maximum value of n is the number of sub-arrays in the column direction) of the refresh interval t ri can be relieved by the relief system according to the present invention.

The test of whether or not the retention time of each memory cell is less than ½ (128 ms) of the refresh interval t ri is carried out as follows.

As shown in FIG. 9, the row address signal is changed, so that, into all the memory cells in the sub-arrays 0 to 3, data are successively written. After this, the row address is changed, so that the data in all the memory cells of the sub-arrays 0 to 3 are read out successively. With reference to one memory cell, the length of time spent from the writing of data to the reading thereof is ½ (128 ms) of the refresh interval t ri.

With respect to each of all the memory cells, the written data and the read data are compared with each other to check whether both data coincide with each other or not. In case the data thus compared have turned out to coincide with each other, it is decided that the retention time is longer than ½ of the refresh interval t ri, while, in case the data compared do not coincide with each other, it is decided that the retention time is less than ½ of the refresh interval t ri.

In the case of this test, it is to be assumed that, as a result of the test, all the memory cells have turned out to have a retention time longer than ½ (128 ms) of the refresh interval t ri.

Figure 14:
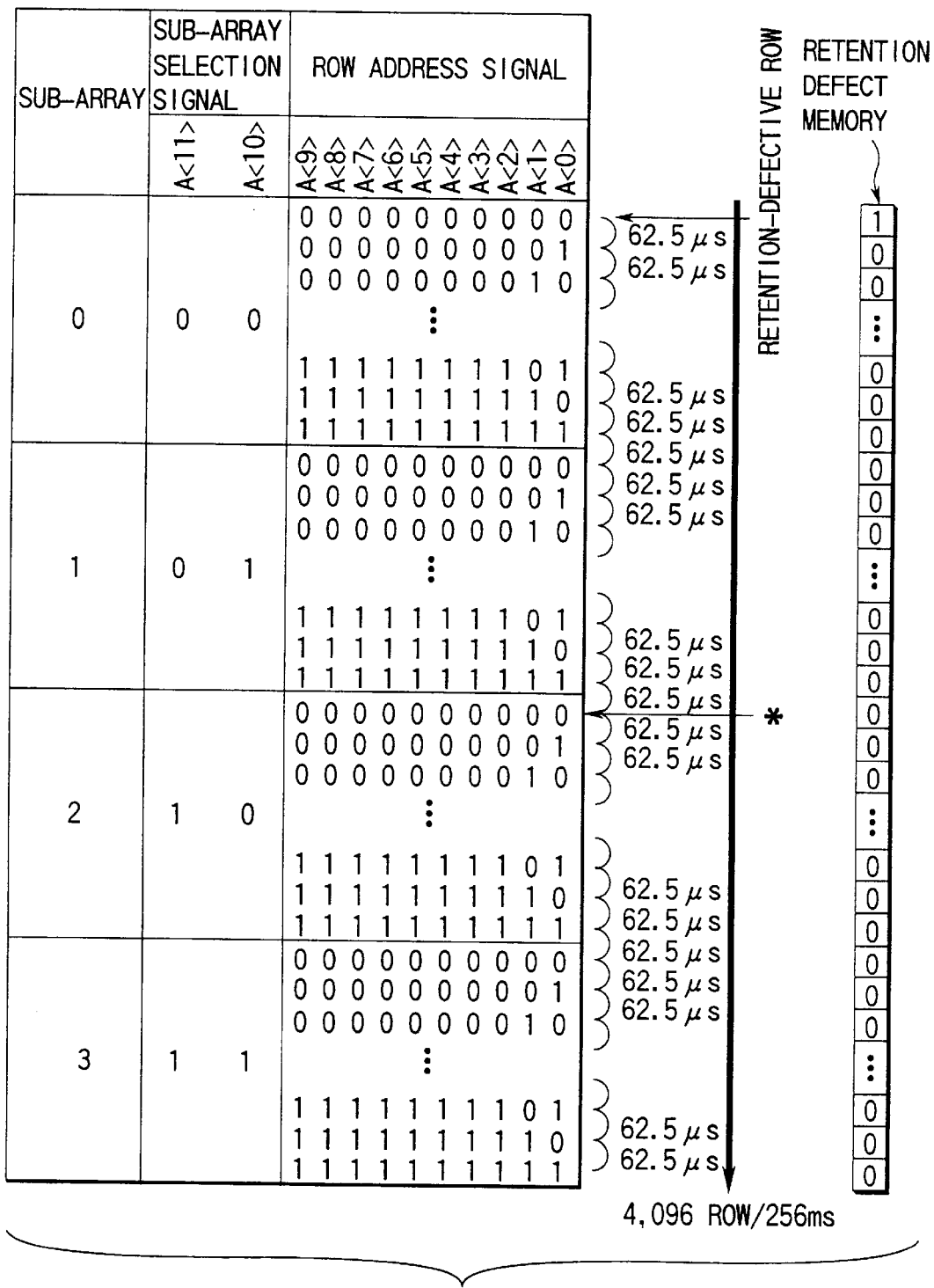
FIG. 14 is a schematic diagram showing how the address signal A <11>–A <0> changes.

Next, as shown in FIG. 14, it is tested as to whether or not there exists memory cells which each have a retention time less than the refresh interval t ri. In this embodiment, those memory cells which each have a retention time longer than ½ of the refresh interval t ri and less than the refresh interval t ri are regarded as objects to be relieved by the relief system according to the present invention.

The row address signal is changed, so that, into all the memory cells in the sub-arrays 0 to 3, data are successively written. After this, the row address is changed, so that the data in all the memory cells in the sub-arrays 0 to 3 are successively read out. With respect to one memory cell, the length of time spent from the writing of the data to the reading thereof is the refresh interval t ri 256 ms).

With respect to each of all the memory cells, the written data and read data are compared with each other to check whether or not the data thus compared coincide with each other. In case the data compared have turned out to coincide with each other, it is decided that the retention time is longer than the refresh interval t ri, while, in case the data compared do not coincide with each other, it is decided that the retention time is less than the refresh inter t ri It is to be assumed that, as a result of this test, it has been found that there exists a retention defect memory cell which has a retention time longer than t ri/2 (128 ms) and less than t ri (256 ms), and that the row address A <11>–A <0> of the memory cell is "000000000000".

In this case, "1" is written into the retention defect memory corresponding to the row address "000000000000" of the memory cell which has a retention defect. For instance, in case the retention defect memory is comprised of a fuse, the writing of "1" is executed by burning out the fuse by a laser. Inc case the retention defect memory is comprised of a non-volatile memory such as an EPROM, the writing of "1" is executed electrically.

Figure 15:
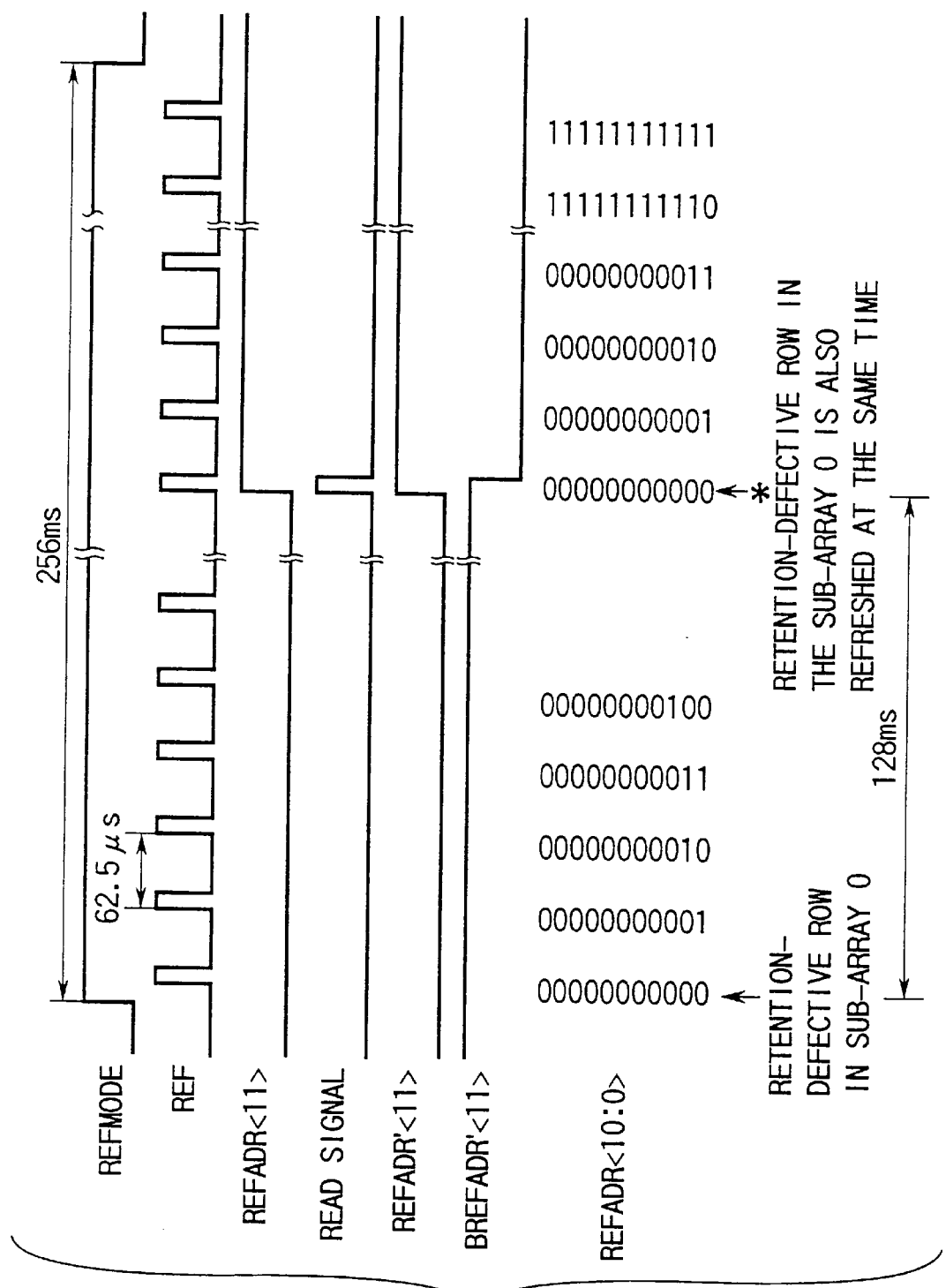
FIG. 15 is a waveform diagram showing the refresh operation performed in the system shown in FIG. 12.

As shown in FIG. 15, when the refresh mode is started, a refresh mode designating signal REFMODE becomes "H" in level. During the period over which the refresh mode designating signal REFMODE is "H" in level, a refresh timer outputs a refresh pulse signal REF at every 62.5 μs. Every time the refresh pulse signal REF is outputted, the count value of the refresh counter is incremented by 1 from "000000000000" to "111111111111".

The memory cell at the row address corresponding to the count value of the refresh counter, that is, the refresh row address signals RADR <11>–RADR <0> and BRADR <11>–BRADR <0> is refreshed.

When the count value of the refresh counter is between "000000000000" and "001111111111", the sub-array 0 is selected, and the rows in the sub-array 0 are successively refreshed. When the count value is "000000000000", the row to which the retention-defective memory cell belongs in the sub-array 0 is refreshed.

When the count value of the refresh counter is between "010000000000" and "011111111111", the sub-array 1 is selected, and the rows in the sub-array 1 are successively refreshed.

When the count value of the refresh counter is between "010000000000" and "011111111111", the sub-array 2 is selected, so that the rows in the sub-array 2 are successively refreshed.

Here, when the count value of the refresh counter is "100000000000", the address value "000000000000" is inputted to the address decoder. In this case, the address decoder accesses the retention defect memory corresponding to the row to which the memory cell having a retention defect belongs. Thus, the read signal outputted from the read circuit becomes "H" in level.

When the read signal is "H" in level, the RADR <11> and BRADR <11> both alike become "1" in the refresh row address converter, so that the sub-arrays 0 and 2 are selected at the same time. Therefore, in the sub-arrays 0 and 2, the rows corresponding to the RADR <9>–RADR <0> are refreshed at the same time.

When the count value of the refresh counter is between "110000000000" and "111111111111", the sub-array 3 is selected, so that the rows in the sub-array 3 are successively refreshed.

In this way, the rows which do not include memory cells having retention defects are refreshed at the refresh interval t ri (256 ms), while those rows which include memory cells having retention defects are refreshed at an interval (128 ms) half the refresh interval t ri.

Therefore, according to the present invention, those memory cells which each have a retention time longer than ½ of the refresh interval t ri can be relieved not by the use of the redundancy circuit.

Further, since the memory cells which have retention defects need not be relieved by the use of the redundancy circuit, the size of the redundancy can be reduced, and thus, the spare decoders and spare lines can also be reduced in number. Further, in the case of this embodiment, no address comparator needs to be provided unlike in the case of the embodiment shown in FIG. 6. Thus, this embodiment can contribute to the reduction in size of the memory chip.

Further, the memory cells which have retention defects are refreshed at every 128 ms, but those memory cells which have no retention defect are refreshed at every 256 ms. That is, all the memory cells need not be refreshed at every 128 ms, so that the power consumption for the refresh operation can be reduced.

Further, the signal line for transmitting the internal row address signal is connected to the row decoders and the comparators in the redundancy circuit which comparators are smaller in number than in the case of the conventional technique. Thus, the load capacity of the signal line can be reduced, and thus, high-speed access becomes possible.

In the above, the present invention has been described by reference to two embodiments thereof, but the present invention can be generalized as follows:

In case it is assumed that t ri stands for the refresh interval in the refresh operation, the memory cells are classified, with respect to the retention time TR, as follows.

Class 1 (t ri≦TR)

This class 1 comprises memory cells which each have a retention time TR longer than the refresh interval t ri. The memory cells belonging to this class are normal memory cells which have no retention defect.

Class 2 (t ri/2≦TR<t ri)

This class comprises memory cells which each have a retention time TR less than the refresh interval t ri and longer than half the refresh interval t ri. The memory cells belonging to this class can be relieved by refreshing them at a period half the refreshing interval t ri.

In order to perform the refresh operation at a period half the refreshing interval t ri, it is sufficient to take the following procedures, depending on the number of sub-arrays in the column direction, that is, the number of the sub-arrays classified by the sub-array selection address.

As shown in FIG. 16, in case the sub-arrays are two in number, it is sufficient to perform a refresh—for the retention-defective cell in, e.g. the sub-array 0—when the address specifying this retention-defective row and the row address of the sub-array 1 which (row address) corresponds to the first-mentioned address are generated. Here, it is to be understood that the sub-array 0 and 1 are selected in due order.

In case the sub-arrays are four ($2^2$) as shown in FIG. 17A, it is sufficient to refresh the retention-defective row in, e.g. the sub-array 0 when the address specifying this retention-defective row and the row address in the sub-array 2 which (row address) corresponds to the first-mentioned address are produced. Here, it is to be understood that the sub-arrays 0 to 3 are selected in due order.

In case the sub-arrays are eight ($2^3$) in number as shown in FIG. 18A, it is sufficient to refresh the retention-defective row in, e.g. the sub-array 0 when the address specifying this retention-defective row and the row address in the sub-array 4 which (row address) corresponds to the first-mentioned address are generated. Here, it is to be understood that the sub-arrays 0 to 7 are selected in regular order from the sub-array 0 to the sub-array 7.

Class 3 (t ri/4≦TR<t ri/2)

This class comprises those memory cells which each have a retention time TR less than ½ of the refresh interval t ri and longer than ¼ of the refresh interval t ri. The memory cells belonging to this class can be relieved by refreshing them at a period ¼ of the refresh interval t ri.

In case the sub-arrays are four ($2^2$) as shown in FIG. 17B, it is sufficient to refresh the retention-defective row in, e.g. the sub-array 0 when the address specifying the retention-defective row and the row addresses in the sub-arrays 1 to 3 which corresponds to the first-mentioned address are generated. Here, it is to be understood that the sub-arrays 0 to 3 are selected in this order from the sub-array 0 to the sub-array 3.

Figure 18B:
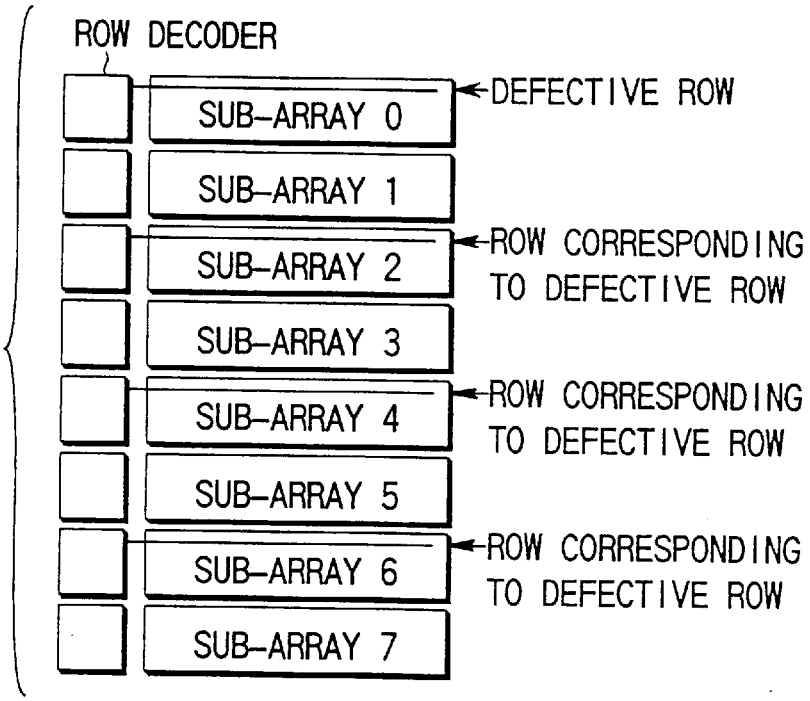

In case the sub-arrays are eight ($2^3$) as shown in FIG. 18B, it is sufficient to refresh the retention-defective row in, e.g. the sub-array 0 when the address specifying this retention-defective row and the row addresses in the sub-arrays 2, 4 and 6 which correspond to the first-mentioned address are generated. Here, it is to be understood that the sub-arrays 0 to 7 are selected in this order from the sub-array 0 to the sub-array 7.

Class 4 (t ri/8≦TR<t ri/4)

This class comprises those memory cells which each have a retention time TR less than ¼ of the refresh interval t ri and longer than ⅛ of the refresh interval t ri. The memory cells belonging to this class can be relieved by refreshing them at a period ⅛ of the refresh interval t ri.

Figure 18C:
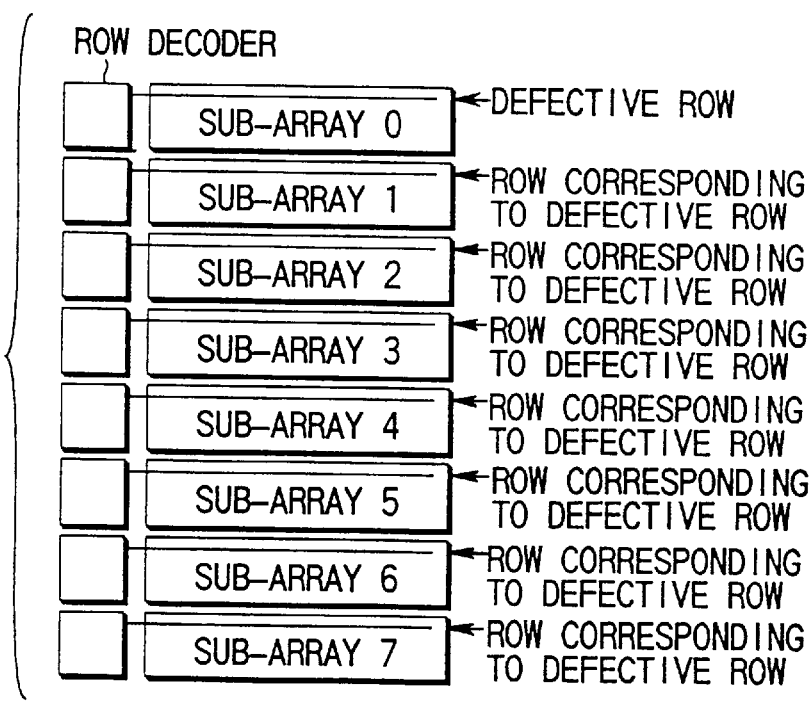

In case the sub-arrays are eight ($2^3$) in number as shown in FIG. 18C, it is sufficient to refresh the retention-defective row in, e.g. Sub-array 0 when the address specifying this retention-defective row and the row addresses in the sub-arrays 1 to 7 which (row addresses) correspond to the first-mentioned address are generated. Here, it is to be understood that the sub-arrays 0 to 7 are selected in due order from the sub-array 0 to the sub-array 7.

In this way, according to the present invention, for the rows including memory cells which each have a short retention time, the refresh interval can substantially be shortened. Further, concerning the refresh interval for the rows including retention-defective memory cells, it can be changed depending on the retention time of the retention-defective memory cells.

In general, the sub-arrays in the column direction are $2^n$ (wherein n stands for a natural number), in case the ordinary refresh interval is t ri, retention-defective memory cells (retention-defective rows) can be relieved by using one of the refresh intervals, t ri/2, t ri/4, . . . t ri/$2^n$. In this case, it is to be understood that the $2^n$ sub-arrays are selected in due order by an n-bit sub-array selection address.

In case a retention-defective memory cell is to be relieved by the use of the refresh interval t ri/$2^i$ (wherein i stands for 1 or 2 or . . . n), the address is written into ($2^i$)–1 sets of retention-defective address memories (FIGS. 6 and 7), and "1" is written into the ($2^i$)–1 bit of the retention defect memory (FIG. 14).

Further, with reference to the higher-order-side i bits of the n-bit sub-array selection address, the complementary signals can be forcedly made to be "1".

Further, in one DRAM chip, in case an ordinary refresh interval is t ri, all of t ri/2, t ri/4, . . . t ri/$2^n$ may be used, or at least one of them may be used.

Figure 19:
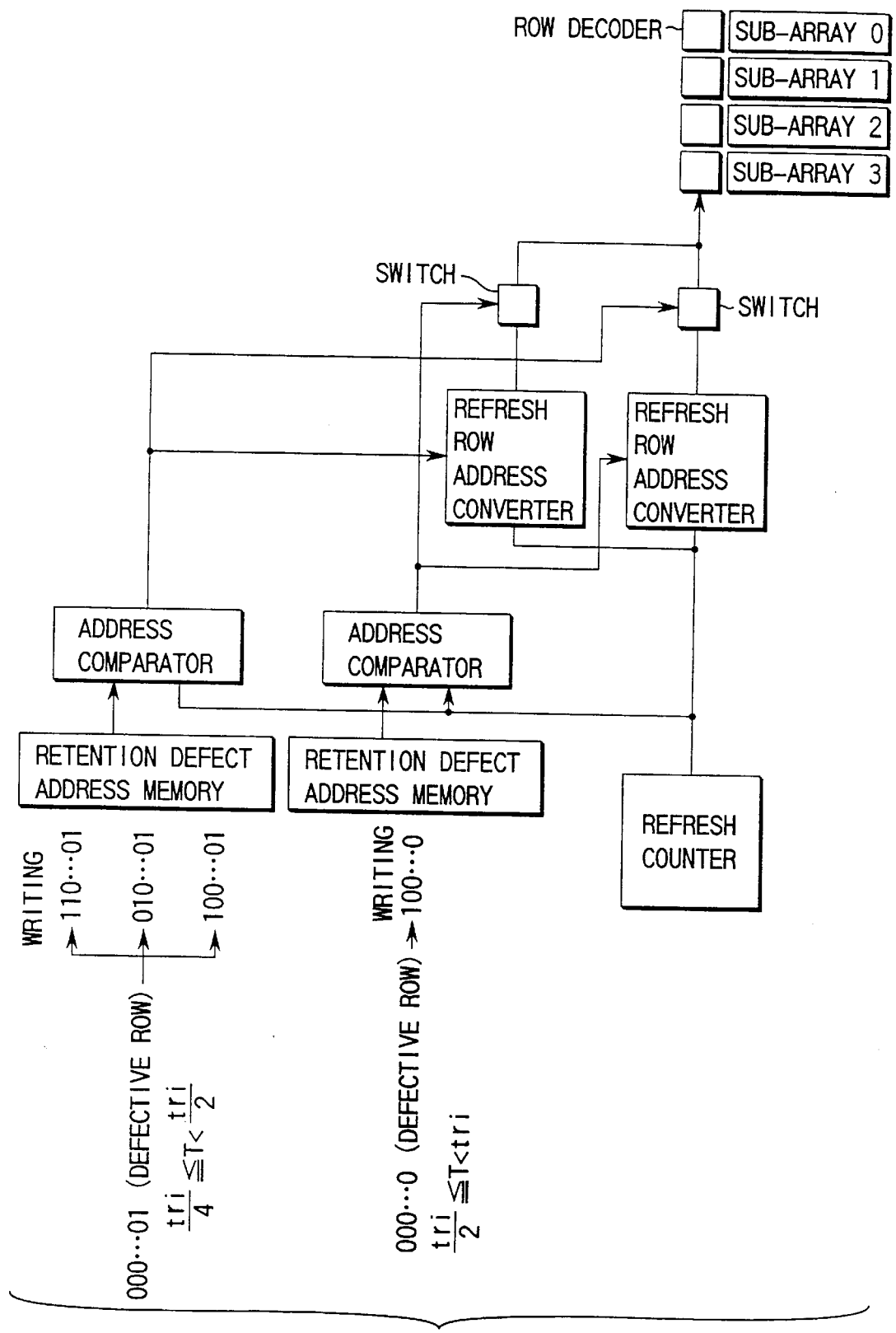
FIG. 19 is a schematic diagram showing a modification of the circuit shown in FIG. 6.
Figure 20:
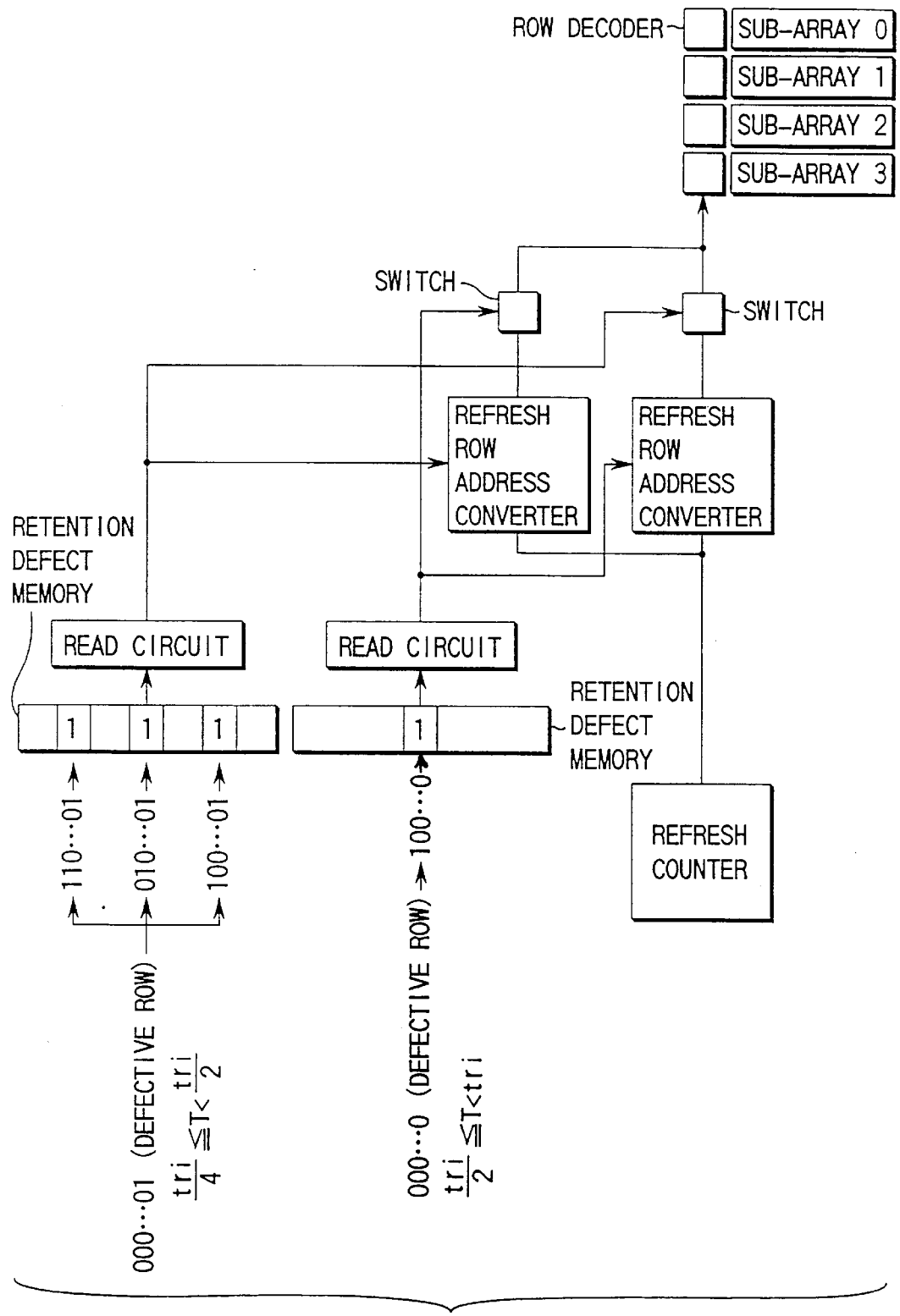
FIG. 20 is a schematic diagram showing a modification of the circuit shown in FIG. 12.

FIG. 19 shows a modification of the circuit shown in FIG. 6. FIG. 20 shows a modification of the circuit shown in FIG. 12.

These modified embodiments are constituted, respectively, in such a manner that, in case the memory cell array includes four sub-arrays, a defective row including a memory cell which has a retention time T less than the refresh interval t ri and longer than ½ of the refresh interval t ri is refreshed at a period ½ of the refresh interval t ri, and a defective row including a memory cell which has a retention time T less than ½ of the refresh interval t ri and longer than ¼ of the refresh interval t ri is refreshed at a period ¼ of the refresh interval t ri.

In the foregoing embodiments, the refresh row address signal is produced by the refresh counter in the chip. However, the refresh row address signal may alternatively be fed to the row decoders from outside the chip.

Further, the retention defect address memories (FIGS. 6 and 7) and the retention defect memory (FIG. 14) can alternatively be composed of fuses which can be burned out by a laser, fuses which can be blown out by an electric current, EPROM, EEPROM, FRAM, or the like.

Figure 21:
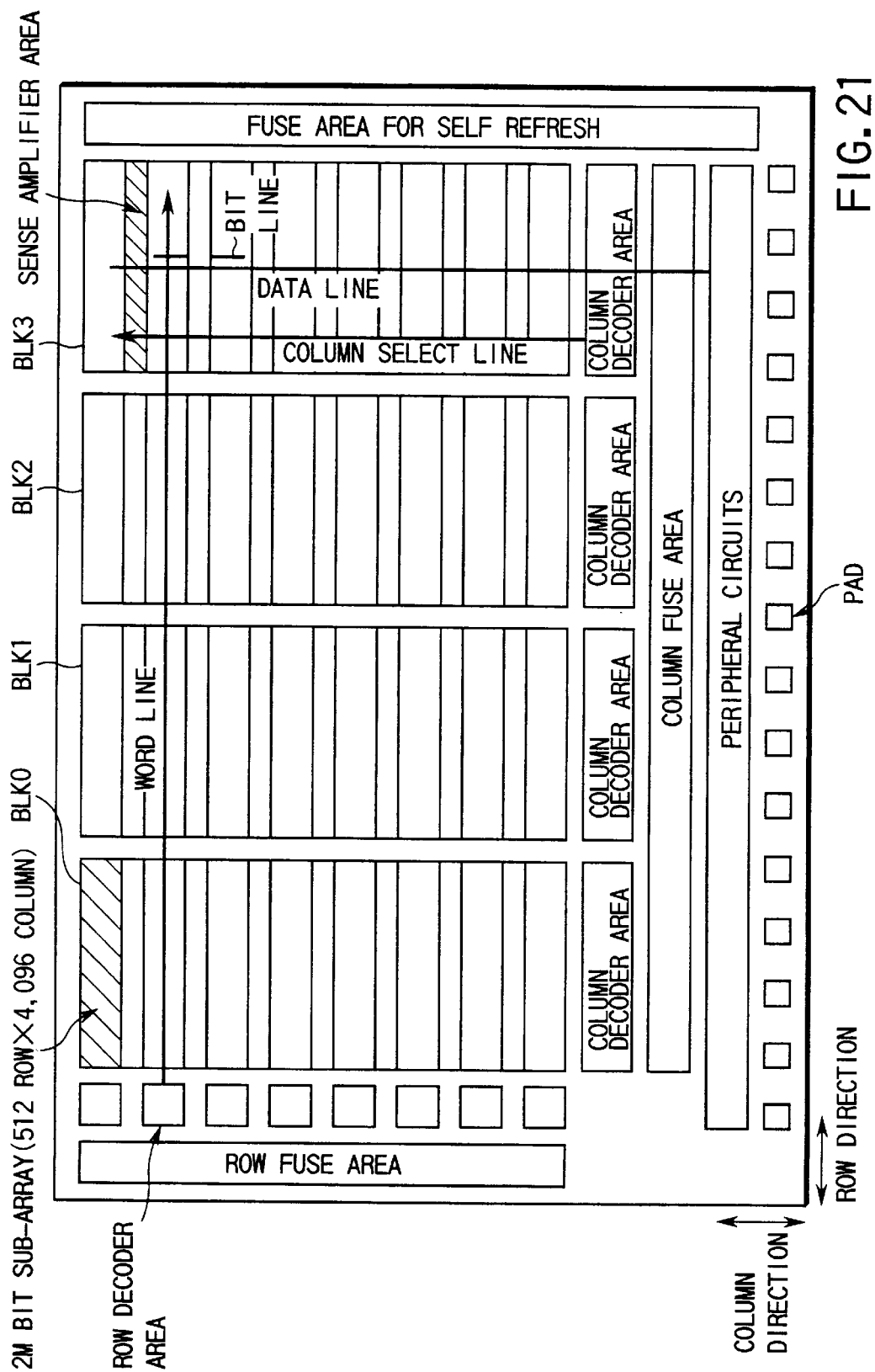
FIG. 21 is a schematic diagram showing another embodiment of the floor plan of the DRAM according to the present invention.

FIG. 21 shows an example of the floor plan of a 64-Mbit DRAM which has eight sub-arrays in the column direction.

In this embodiment, the sub-arrays in the column direction, that is, the sub-arrays classified by a sub-array selection address are eight in number, so that, in case the refresh interval is set to t ri, the retention-defective memory cells (retention-defective rows) can be relieved by using one of the refresh intervals, t ri/2, t ri/4, . . . t ri/$2^n$. The eight sub-arrays are selected in due order by a three-bit sub-array selection address.

Next, the floor plan of this embodiment will be briefly described.

The memory cell array is comprised of four blocks BLK0 to BLK3 disposed in the row direction. The respective blocks BLK0 to BLK3 each have a memory capacity of 16 mega bits. The respective blocks BLK0 to BLK3 are each comprised of eight 2-Mbit sub-arrays disposed in the column direction. Accordingly, the memory cell array as a whole comprises thirty-two 2-Mbit sub-arrays.

Each sub-array has 512 rows (word lines) and 4,096 columns. Between the eight sub-arrays in each block, sense amplifier areas are disposed. The bit lines extend in the column direction from the sense amplifier areas.

Row decoder areas are disposed at one-end side, in the row direction, of the four blocks BLK0 to BLK3. The word lines extend from the row decoder areas to the other end side in the row direction. The word lines are provided in common to the four blocks BLK0 to BLK3. A row fuse area is disposed adjacent to the row decoders. In the row fuse area, there are formed fuses in which defective row addresses are stored.

The column decoder areas are disposed at one-end side, in the column direction, of the respective blocks BLK0 to BLK3. Column selection lines extend from the column decoder areas to the other end side, in the column direction, of the respective blocks BLK0 to BLK3. A column fuse area is disposed adjacent to the column decoders. In the column fuse area, there are formed fuses in which defective column addresses are stored.

Peripheral circuits are disposed at one-end side, in the column direction, of the respective blocks BLK0 to BLK3.

The peripheral circuits include various circuits such as a data input/output circuit, an address input circuit, a refresh counter, etc. Data lines extend from the peripheral circuits to the other end in the column direction.

A fuse area for self-refresh is disposed along one side of the chip. In this fuse area, a retention-defective address memories (FIGS. 6 and 7) or a retention defect address memory (FIG. 14) are formed. The fuse area for self-refresh is disposed along one side of the chip, but may alternatively be disposed on any other portion of the chip. It is because the signal delay matters very little.

Pads are disposed, for instance, adjacent to the peripheral circuits and at positions located along one side of the chip.

The above-mentioned effects achieved by the present invention may be summarized as follows:

(1) Those rows which include no retention-defective memory cell are refreshed at the refresh interval t ri, while those rows which includes retention-defective memory cells are refreshed at an interval $1/2^i$ of the refresh interval t ri.

Therefore, according to the present invention, those retention-defective memory cells which each have a retention time less than the refresh interval t ri and longer than $1/2^i$ of the refresh interval t ri can be relieved without using the redundancy circuit.

(2) Since the retention-defective memory cells need not be relieved by the use of the redundancy circuit, the size of the redundancy circuit can be reduced, and thus, the spare decoders and the spare lines can be reduced in number. Thus, the present invention can contribute to the reduction in size of the memory chip.

(3) As for the memory cells which have retention defects. Refresh is executed every time the period of $1/2^i$ of the refresh interval t ri elapses, but as for the memory cells which have no retention defect, refresh is executed every time the refresh interval t ri elapses. That is, there is no need of refreshing all the memory cells at every short interval, so that the power consumption for the refresh operation can be reduced.

(4) The signal line for transmitting the internal row address signal is connected to the row decoders and the comparators in the redundancy circuit which comparators are smaller in number than in the case of the conventional device; and therefore, the load capacity of this signal line can be reduced, and thus, high-access becomes possible.

(5) The system according to the present invention is applied to whole of the sub-arrays. That is, it is not that the present invention is applied to each sub-array separately as in the case of the conventional redundancy element. Thus, the memory cell relief efficiency of the present invention is high, and the manufacturing yield can be enhanced.

(6) In case retention-defective memory cells are relieved by the use of a redundancy circuit, an address comparison is made, and thereafter, access to the memory cells are executed. Thus, a critical path is formed in the redundancy circuit, so that the redundancy circuit must be disposed, for instance, in the vicinity of the row decoders. In contrast, in the case of the system according to the present invention, the relief of the retention-defective memory cells is effected when refresh is executed, thus becoming irrelevant to the access operation. That is, in the system according to the present invention, no critical path is formed, so that, on the position of the redundancy circuit within the chip, no restriction is imposed. As a result, the layout pertaining to the circuit arrangement in the chip is facilitated, which can contribute to the reduction in size of the chip.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dynamic random access memory comprising:

a memory cell array including 1st, 2nd, . . . $2^n$-th (wherein n stands for a natural number) sub-arrays;

a refresh counter which produces an n-bit sub-array selection signal for selecting one of the 1st, 2nd, . . . $2^n$-th sub-arrays and a row address signal for selecting one of a plurality of rows in the respective sub-arrays, when refresh is executed; and a refresh row address signal generator for converting the sub-array selection signal to a new sub-array selection signal for selecting the m-th (wherein m stands for 1, 2, . . . or $2^n$) sub-array and the k-th (wherein k stands for 1, 2, . . . or $2^n$, and k≠m) sub-array at the same time, when the m-th sub-array includes a defective row having a retention-defective memory cell and when the sub-array selection signal selects the k-th sub-array and the row address signal coincides with the row address signal of the defective row.

2. The dynamic random access memory according to claim 1, wherein the refresh row address signal generator is comprised of:

retention defect address memory which store therein an address for selecting the k-th sub-array and an address for selecting the defective row;

address comparator which makes comparison between the address for selecting the k-th sub-array and the sub-array selection address signal and makes comparison between the address for selecting the defective row and the row address signal; and a refresh row address converter which, in case the result of the comparison made by the address comparator has turned out to be coincident, effects the conversion of the sub-array selection address signal.

3. The dynamic random access memory according to claim 1, wherein the refresh row address signal generator is comprised of a retention defect memory which is composed of a plurality of bits corresponding to a plurality of rows in the 1st, 2nd, . . . $2^n$-th sub-arrays and in which, into the bit corresponding to the defective row in the m-th sub-array, data indicative of the defect is written, an address decoder constituted in such a manner that, when the sub-array selection address signal has selected the k-th sub-array and the row address signal has become the same as the row address signal for selecting the defective row, the address decoder accesses the bit corresponding to the defective row in the m-th sub-array, a read circuit which reads out data indicative of the defect from the bit corresponding to the defective row in the m-th sub-array, and a refresh row address converter which performs the conversion of the sub-array selection address signal on the basis of the data indicative of the defect.

4. The dynamic random access memory according to claim 1, wherein a retention time of the retention-defective memory cell is less than a refresh interval t ri and longer than $1/2^n$ of the refresh interval t ri.

5. The dynamic random access memory according to claim 1, wherein, in case the n is 2, that is, in case the memory cell array includes 1st, 2nd, 3rd and 4th sub-arrays, and a retention time of the retention-defective memory cell is less than a refresh interval t ri and longer than ½ of the refresh interval t ri, the k is 3 when the m is 1, the k is 4 when the m is 2, the k is 1 when the m is 3, and the k is 2 when the m is 4.

6. The dynamic random access memory according to claim 5, wherein the defective row is repeatedly selected at an interval ½ of the refresh interval t ri, and the rows other than the defective row are repeatedly selected at the refresh interval t ri.

7. The dynamic random access memory according to claim 1, wherein, in case the n is 2, that is, in case the memory cell array includes 1st, 2nd, 3rd and 4th sub-arrays, and a retention time of the retention-defective memory cell is less than ½ of a refresh interval t ri and longer than ¼ of the refresh interval t ri, the k is 2, 3 or 4 when the m is 1, the k is 1, 3 or 4 when the m is 2, the k is 1, 2 or 4 when the m is 3, and the k is 1, 2 or 3 when the m is 4.

8. The dynamic random access memory according to claim 7, wherein the defective row is repeatedly selected at an interval ¼ of the refresh interval t ri, and the rows other than the defective row are repeatedly selected at the refresh interval t ri.

9. The dynamic random access memory according to claim 1, wherein in case the n is 4, that is, in case the memory cell array includes 1st, 2nd, 3rd, 4th, 5th, 6th, 7th and 8th sub-arrays, and a retention time of the retention-defective memory cell is less than a refresh interval t ri and longer than ½ of the refresh interval t ri, the k is 5 when the m is 1, the k is 6 when the m is 2, the k is 7 when the m is 3, the k is 8 when the m is 4, the k is 1 when the m is 5, the k is 2 when the m is 6, the k is 3 when the m is 7, and the k is 4 when the m is 8.

10. The dynamic random access memory according to claim 9, wherein the defective row is repeatedly selected at an interval ½ of the refresh interval t ri, and the rows other than the defective row are repeatedly selected at the refresh interval t ri.

11. The dynamic random access memory according to claim 1, wherein in case the n is 4, that is, in case the memory array includes 1st, 2nd, 3rd, 4th, 5th, 6th, 7th and 8th sub-arrays, and a retention time of the retention-defective memory cell is less than ½ of a refresh interval t ri and the longer than ¼ of the refresh interval t ri, the k is 3, 5 or 7 when the m is 1, the k is 4, 5 or 8 when the m is 2, the k is 1, 5 or 7 when the m is 3, the k is 2, 6 or 8 when the m is 4, the k is 1, 3 or 7 when the m is 5, the k is 2, 4 or 8 when the m is 6, the k is 1, 3 or 5 when the m is 7, and the k is 2, 4 or 6 when the m is 8.

12. The dynamic random access memory according to claim 11, wherein the defective row is repeatedly selected at an interval ¼ of the refresh interval t ri, and the rows other than the defective row is repeatedly selected at the refresh interval t ri.

13. The dynamic random access memory according to claim 1, wherein in case the n is 4, that is, in case the memory cell array includes 1st, 2nd, 3rd, 4th, 5th, 6th, 7th and 8th sub-arrays, and a retention time of the retention-defective memory cell is less than ¼ of a refresh interval t ri and longer than ⅛ of the refresh interval t ri, the k is 2, 3, 4, 5, 6, 7 or 8 when the m is 1, the k is 1, 3, 4, 5, 6, 7 or 8 when the m is 2, the k is 1, 2, 4, 5, 6, 7 or 8 when the m is 3, the k is 1, 2, 3, 5, 6, 7 or 8 when the m is 4, the k is 1, 2, 3, 4 ,6, 7 or 8 when the m is 5, the k is 1, 2, 3, 4, 5, 7 or 8 when the m is 6, the k is 1, 2, 3, 4, 5, 6 or 8 when the m is 7, and the k is 1, 2, 3, 4, 5, 6 or 7 when the m is 8.

14. The dynamic random access memory according to claim 13, wherein the defective row is repeatedly selected at an interval ⅛ of the refresh interval t ri, and the rows other than the defective row are repeatedly selected at the refresh interval t ri.

15. The dynamic random access memory comprising:

a memory cell array including 1st, 2nd, ... $2^n$-th (wherein n stands for a natural number) sub-arrays;

a refresh counter which produces an n-bit sub-array selection signal for selecting one of the 1st, 2nd, ... $2^n$-th sub-arrays and a row address signal for selecting one of a plurality of rows in the respective sub-arrays, when refresh is executed; and a refresh row address signal generator for converting the sub-array selection signal to a new sub-array selection signal for selecting the m-th (wherein m stands for 1, 2, ... or $2^n$) sub-array and the k-th (wherein k stands for 1, 2, ... or $2^n$, and k≠m) sub-array at the same time, when the m-th sub-array includes a defective row having a retention-defective memory cell which has a retention time less than a refresh interval t ri and longer than $1/2^n$ of the refresh interval t ri and when the sub-array selection signal selects the k-th sub-array and the row address signal coincides with the row address signal of the defective row.

16. The dynamic random access memory according to claim 15, wherein the defective row is repeatedly selected at an interval $1/2^n$ of the refresh interval t ri, and the rows other than the defective row are repeatedly selected at the refresh interval t ri.

17. The dynamic random access memory comprising:

a memory cell array including 1st, 2nd, ... $2^n$-th (wherein n stands for a natural number) sub-arrays;

a refresh counter which produces an n-bit sub-array selection signal for selecting one of the 1st, 2nd, ... $2^n$-th sub-arrays and a row address signal for selecting one of a plurality of rows in the respective sub-arrays, when refresh is executed; and a refresh row address signal generator for converting the sub-array selection signal to a first new sub-array selection signal for selecting the m-th (wherein m stands for 1, 2, ... or $2^n$) sub-array and the k-th (wherein k stands for 1, 2, . . . or $2^n$, and k≠m) sub-array at the same time, when the m-th sub-array includes a first defective row having a first retention-defective memory cell which has a retention time less than a refresh interval t ri and longer than ½ of the refresh interval t ri and when the sub-array selection signal selects the k-th sub-array and the row address signal coincides with the row address signal of the first defective row, and for converting the sub-array selection signal to a second new sub-array selection signal for selecting the p-th (wherein p stands for 1, 2, . . . or $2^n$) sub-array and the q-th (wherein q stands for 1, 2, . . . or $2^n$, and q≠p) sub-array at the same time, when the p-th sub-array includes a second defective row having a second retention-defective memory cell which has a retention time less than ½ of the refresh interval t ri and longer than ¼ of the refresh interval t ri and when the sub-array selection signal select s the q-th sub-array and the row address signal coincides with the row address signal of the second defective row.

18. The dynamic random access memory according to claim 17, wherein
the first defective row is repeatedly selected at an interval ½ of the refresh interval t ri, the second defective row is repeatedly selected at an interval ¼ of the refresh interval t ri, and the rows other than the defective rows are repeatedly selected at the refresh interval t ri.

19. The dynamic random access memory comprising:
a memory cell array including 1st, 2nd, . . . $2^n$-th (wherein n stands for a natural number) sub-arrays;
a refresh counter which produces an n-bit sub-array selection signal for selecting one of the 1st, 2nd, . . . $2^n$-th sub-arrays and a row address signal for selecting one of a plurality of rows in the respective sub-arrays, when refresh is executed; and
a refresh row address signal generator for converting the sub-array selection signal to a first new sub-array selection signal for selecting the m-th (wherein m stands for 1, 2, . . . or $2^n$) sub-array and the k-th (wherein k stands for 1, 2, . . . or $2^n$, and k≠m) sub-array at the same time, when the m-th sub-array includes a first defective row having a first retention-defective memory cell which has a retention time less than a refresh interval t ri and longer than ½ of the refresh interval t ri and when the sub-array selection signal selects the k-th sub-array and the row address signal coincides with the row address signal of the first defective row, and for converting the sub-array selection signal to a second new sub-array selection signal for selecting the p-th (wherein p stands for 1, 2, . . . or $2^n$) sub-array and the q-th (wherein q stands for 1, 2, . . . or $2^n$, and q≠p) sub-array at the same time, when the p-th sub-array includes a second defective row having a second retention-defective memory cell which has a retention time less than ½ of the refresh interval t ri and longer than ¼ of the refresh interval t ri and when the sub-array selection signal selects the q-th sub-array and the row address signal coincides with the row address signal of the second defective row, and for converting the sub-array selection signal to a third new sub-array selection signal for selecting the x-th (wherein x stands for 1, 2, . . . or $2^n$) sub-array and the y-th (wherein y stands for 1, 2, . . . or $2^n$, and y≠x) sub-array at the same time, when the x-th sub-array includes a third defective row having a third retention-defective memory cell which has a retention time less than ¼ of the refresh interval t ri and longer than ⅛ of the refresh interval t ri and when the sub-array selection signal selects the y-th sub-array and the row address signal coincides with the row address signal of the third defective row.

20. The dynamic random access memory according to claim 18, wherein
the first defective row is repeatedly selected at an interval ½ of the refresh interval t ri, the second defective row is repeatedly selected at an interval ¼ of the refresh interval t ri, the third defective row is repeatedly selected at an interval ⅛ of the refresh interval t ri and the rows other than the defective rows are repeatedly selected at the refresh interval t ri.

21. The dynamic random access memory comprising:
a memory cell array including 1st, 2nd, . . . $2^n$-th (wherein n stands for a natural number) sub-arrays;
a refresh counter which produces an n-bit sub-array selection signal for selecting one of the 1st, 2nd, . . . $2^n$-th sub-arrays and a row address signal for selecting one of a plurality of rows in the respective sub-arrays, when refresh is executed; and
a refresh row address signal generator for converting the sub-array selection signal to a first new sub-array selection signal for selecting the m-th (wherein m stands for 1, 2, . . . or $2^n$) sub-array and the k-th (wherein k stands for 1, 2, . . . or $2^n$, and k≠m) sub-array at the same time, when the m-th sub-array includes a first defective row having a first retention-defective memory cell which has a retention time less than a refresh interval t ri and longer than ½ of the refresh interval t ri and when the sub-array selection signal selects the k-th sub-array and the row address signal coincides with the row address signal of the first defective row, and for converting the sub-array selection signal to a second new sub-array selection signal for selecting the p-th (wherein p stands for 1, 2, . . . or $2^n$) sub-array and the q-th (wherein q stands for 1, 2, . . . or $2^n$, and q≠p) sub-array at the same time, when the p-th sub-array includes a second defective row having a second retention-defective memory cell which has a retention time less than ½ of the refresh interval t ri and longer than ¼ of the refresh interval t ri and when the sub-array selection signal selects the q-th sub-array and the row address signal coincides with the row address signal of the second defective row, and for converting the sub-array selection signal to a third new sub-array selection signal for selecting the x-th (wherein x stands for 1, 2, . . . or $2^n$) sub-array and the y-th (wherein y stands for 1, 2, . . . or $2^n$, and y≠x) sub-array at the same time, when the x-th sub-array includes a third defective row having a third retention-defective memory cell which has a retention time less than $1/2^{n-1}$ of the refresh interval t ri and longer than $1/2^n$ of the refresh interval t ri and when the sub-array selection signal selects the y-th sub-array and the row address signal coincides with the row address signal of the third defective row.

22. The dynamic random access memory according to claim 21, wherein
the first defective row is repeatedly selected at an interval ½ of the refresh interval t ri, the second defective row is repeatedly selected at an interval ¼ of the refresh interval t ri, the third defective row is repeatedly selected at an interval $1/2^n$ of the refresh interval t ri, and the rows other than the above-mentioned defective rows are repeatedly selected at the refresh interval t ri.

* * * * *